US010311928B2

(12) United States Patent
Seo et al.

(10) Patent No.: US 10,311,928 B2
(45) Date of Patent: Jun. 4, 2019

(54) SEMICONDUCTOR DEVICES INCLUDING REVERSIBLE AND ONE-TIME PROGRAMMABLE MAGNETIC TUNNEL JUNCTIONS

(71) Applicants: Boyoung Seo, Suwon-si (KR); Yongkyu Lee, Gwacheon-si (KR); Gwanhyeob Koh, Seoul (KR); Choong Jae Lee, Hwaseong-si (KR)

(72) Inventors: Boyoung Seo, Suwon-si (KR); Yongkyu Lee, Gwacheon-si (KR); Gwanhyeob Koh, Seoul (KR); Choong Jae Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/293,782

(22) Filed: Oct. 14, 2016

(65) Prior Publication Data

US 2017/0110171 A1 Apr. 20, 2017

(30) Foreign Application Priority Data

Oct. 15, 2015 (KR) .................. 10-2015-0144117
Nov. 16, 2015 (KR) .................. 10-2015-0160551

(51) Int. Cl.
| | |
|---|---|
| G11C 11/00 | (2006.01) |
| G11C 17/02 | (2006.01) |
| G11C 11/16 | (2006.01) |
| H01L 27/22 | (2006.01) |
| H01L 43/08 | (2006.01) |
| H01L 43/10 | (2006.01) |

(52) U.S. Cl.
CPC ........ *G11C 11/161* (2013.01); *G11C 11/1673* (2013.01); *G11C 11/1675* (2013.01); *G11C 17/02* (2013.01); *H01L 27/228* (2013.01); *H01L 43/08* (2013.01); *H01L 43/10* (2013.01)

(58) Field of Classification Search
CPC ... G11C 17/16; G11C 13/003; G11C 11/1675; G11C 13/0004; G11C 17/165; G11C 13/0002; G11C 13/0007
See application file for complete search history.

(56) References Cited

U.S. PATENT DOCUMENTS

| | | | |
|---|---|---|---|
| 7,411,814 | B2 | 8/2008 | Lenssen |
| 7,894,248 | B2* | 2/2011 | Yu ........................... G11C 11/16 365/158 |
| 8,107,285 | B2 | 1/2012 | Worledge |
| 8,547,736 | B2 | 10/2013 | Rao et al. |
| 8,804,410 | B2 | 8/2014 | Oh et al. |

(Continued)

OTHER PUBLICATIONS

U.S. Office Action dated Apr. 5, 2019 for corresponding U.S. Appl. No. 16/290,102.

*Primary Examiner* — Hien Nguyen
(74) *Attorney, Agent, or Firm* — Harness, Dickey & Pierce, P.L.C.

(57) ABSTRACT

A semiconductor device includes a memory cell array, which further includes an array of first magnetic memory cells and an array of second magnetic memory cells. Each of the first magnetic memory cells includes a first magnetic tunnel junction structure having a reversible resistance state, and each of the second magnetic memory cells includes a second magnetic tunnel junction structure having a one-time programmable (OTP) resistance state.

19 Claims, 14 Drawing Sheets

(56) References Cited

U.S. PATENT DOCUMENTS

| | | |
|---|---|---|
| 2005/0195627 A1 | 9/2005 | Hutchens et al. |
| 2007/0133269 A1* | 6/2007 | Lee .................... G11C 11/5678 |
| | | 365/163 |
| 2010/0091546 A1* | 4/2010 | Liu ........................ G11C 17/02 |
| | | 365/97 |
| 2010/0220517 A1 | 9/2010 | Okayama |
| 2010/0328992 A1* | 12/2010 | Kano ..................... G11C 11/005 |
| | | 365/158 |
| 2014/0010006 A1* | 1/2014 | Rao ........................ G11C 11/16 |
| | | 365/171 |
| 2014/0071738 A1 | 3/2014 | Kim et al. |
| 2015/0236253 A1* | 8/2015 | Whig ..................... H01L 43/12 |
| | | 438/3 |

\* cited by examiner

SEMICONDUCTOR DEVICES INCLUDING REVERSIBLE AND ONE-TIME PROGRAMMABLE MAGNETIC TUNNEL JUNCTIONS

CROSS-REFERENCE TO RELATED APPLICATIONS

This U.S. non-provisional patent application claims priority under 35 U.S.C. §119 to Korean Patent Application Nos. 10-2015-0144117, filed on Oct. 15, 2015, and 10-2015-0160551, filed on Nov. 16, 2015, in the Korean Intellectual Property Office, the entire contents of which are incorporated herein by reference.

BACKGROUND

Field

Example embodiments relate to semiconductor devices, such as magnetic memory devices.

Description of Related Art

Due to the increased demand for electronic devices with faster speeds and/or lower power consumption, semiconductor devices require faster operating speeds and/or lower operating voltages. A magnetic memory device has been suggested to satisfy such requirements. For example, magnetic memory devices may provide technical advantages, such as relatively low latency and/or non-volatility. As a result, magnetic memory devices re being regarded as an emerging next-generation memory device.

A magnetic memory device may include a magnetic tunnel junction (MTJ). The MTJ may include two magnetic layers and a tunnel barrier layer interposed therebetween. Resistance of the MTJ may vary depending on magnetization directions of the magnetic layers. For example, the resistance of the MTJ may be higher when magnetization directions of the magnetic layers are anti-parallel than when they are parallel. Such a difference in resistance may be used to store data in a magnetic memory device.

SUMMARY

One or more example embodiments of inventive concepts provide more highly-integrated magnetic memory devices.

One or more example embodiments of inventive concepts provide more highly-reliable magnetic memory devices.

At least one example embodiment provides a semiconductor device, comprising: a plurality of word lines; a plurality of bit lines crossing the plurality of word lines, the plurality of bit lines including first bit lines and second bit lines, the second bit lines spaced apart from the first bit lines in a direction of extension of the plurality of word lines; a plurality of first memory cells connected between the plurality of word lines and the first bit lines, each of the plurality of first memory cells including a first memory element and a first selection element, the first memory element and the first selection element connected to each other; and a plurality of second memory cells connected between the plurality of word lines and the second bit lines, each of the plurality of second memory cells including a second memory element and a second selection element, the second memory element and the second selection element connected to each other. The first memory element includes a first magnetic tunnel junction, and the second memory element includes a second magnetic tunnel junction, each of the first and second magnetic tunnel junctions including a pinned layer, a free layer, and a tunnel barrier layer between the pinned layer and the free layer. The tunnel barrier layers of a first portion of the second magnetic tunnel junctions have an irreversible resistance state.

According to at least some example embodiments, the plurality of first memory cells may be rewritable memory cells, and the plurality of second memory cells may be one-time programmable memory cells.

The first magnetic tunnel junction may have a rewritable structure, and may be configured to have one of (i) a first resistance corresponding to first data, and (ii) a second resistance corresponding to second data. At least one second magnetic tunnel junction among the first portion of the second magnetic tunnel junctions may have a third resistance corresponding to the first data, the at least one second magnetic tunnel junction having been programmed through a first one-time programming operation. At least one other second magnetic tunnel junction from among the first portion of the second magnetic tunnel junctions may have fourth resistance corresponding to the second data, the at least one other second magnetic tunnel junction having been programmed through a second one-time programming operation. The first to fourth resistances may be different from each other.

The first resistance may be lower than the second resistance, the third resistance may be lower than the first resistance, and the fourth resistance may be between the first and second resistances.

One or more of the plurality of first memory cells may be configured as one or more first reference cells for a reading operation on the plurality of first memory cells, and one or more of the plurality of second memory cells may be configured as one or more second reference cells for a reading operation on the plurality of second memory cells.

The one or more of the plurality of first memory cells may include one or more pairs of first memory cells, and a pair of first memory cells among the one or more pairs of first memory cells may be connected in parallel to one of the first bit lines.

A first magnetic tunnel junction of a first memory cell among the pair of first memory cells may be programmed to have the first resistance, a first magnetic tunnel junction of another first memory cell among the pair of first memory cells may be programmed to have the second resistance.

The one or more second reference cells may be second memory cells including the second magnetic tunnel junctions.

According to at least some example embodiments, the device may further include: a control resistor electrically connected to the one or more second reference cells; wherein a reference resistance for the reading operation on the plurality of second memory cells may be a sum of the third resistance and a fifth resistance of the control resistor. The sum of the third and fifth resistances may be between the third resistance and the fourth resistance.

According to at least some example embodiments, the device may further include: a first peripheral circuit electrically connected to the plurality of first memory cells through the first bit lines; and a second peripheral circuit electrically connected to the plurality of second memory cells through the second bit lines. The second peripheral circuit may include at least one second peripheral transistor configured to operate according to a voltage higher than a first peripheral transistor of the first peripheral circuit.

The first peripheral transistor may include a first peripheral gate dielectric layer and a first peripheral gate electrode. The at least one second peripheral transistor may include a second peripheral gate dielectric layer and a second peripheral gate electrode, and the second peripheral gate dielectric layer may have a thickness greater than that of the first peripheral gate dielectric layer.

The second peripheral gate electrode may have a width greater than a width of the first peripheral gate electrode.

At least one other example embodiment provides a semiconductor device, comprising: a memory cell array including an array of reprogrammable cells and an array of one-time programmable (OTP) cells; a first peripheral circuit electrically connected to the array of reprogrammable cells through first bit lines; and a second peripheral circuit electrically connected to the array of OTP cells through second bit lines. The array of reprogrammable cells includes a plurality of first memory cells, each of the plurality of first memory cells including a first magnetic tunnel junction and a first selection transistor, the first magnetic tunnel junction and the first selection transistor connected to each other. The array of OTP cells includes a plurality of second memory cells, each of the plurality of second memory cells including a second magnetic tunnel junction and a second selection transistor, the second magnetic tunnel junction and the second selection transistor connected to each other. A first portion of the second magnetic tunnel junctions have an irreversible resistance state.

According to at least some example embodiments, the first magnetic tunnel junction may have a rewritable structure, and one of (i) a first resistance corresponding to first data, and (ii) a second resistance corresponding to second data. At least one second magnetic tunnel junction among the first portion of the second magnetic tunnel junctions may have a third resistance corresponding to the first data, the at least one second magnetic tunnel junction among the first portion of the second magnetic tunnel junctions having been programmed through a first one-time programming operation. At least one second magnetic tunnel junction among a second portion of the second magnetic tunnel junctions may have a fourth resistance corresponding to the second data, the at least one second magnetic tunnel junction among the second portion of the second magnetic tunnel junctions having been programmed through a second one-time programming operation. The first resistance may be lower than the second resistance, the third resistance may be lower than the first resistance, and the fourth resistance may be between the first and second resistances.

One or more first memory cells among the plurality of first memory cells may be configured as one or more first reference cells for a reading operation on the plurality of first memory cells, and one or more second memory cells among the plurality of second memory cells may be configured as one or more second reference cells for a reading operation on the plurality of second memory cells.

The second peripheral circuit may include a control resistor electrically connected to the one or more second reference cells. A reference resistance for the reading operation on the plurality of second memory cells may be a sum of the third resistance and a resistance of the control resistor.

One or more of the plurality of first memory cells may be configured as one or more reference cells for a reading operation on the plurality of first memory cells. The array of OTP cells may further include a second reference cell for a reading operation on the plurality of second memory cells. The second reference cell may include a third selection transistor connected to one of the second bit lines without a variable resistance device arranged between the third selection transistor and the one of the second bit lines.

The second peripheral circuit may include a control resistor electrically connected to the second reference cell. A reference resistance for the reading operation on the plurality of second memory cells may be a resistance of the control resistor.

The first peripheral circuit may include at least one first peripheral transistor, the second peripheral circuit may include at least one second peripheral transistor, and the at least one second peripheral transistor may be configured to operate in response to a voltage higher than the at least one first peripheral transistor.

At least one other example embodiment provides a semiconductor device comprising: a memory cell array including an array of first magnetic memory cells and an array of second magnetic memory cells, each of the first magnetic memory cells including a first magnetic tunnel junction structure having a reversible resistance state, and each of the second magnetic memory cells including a second magnetic tunnel junction structure having a one-time programmable (OTP) resistance state.

According to at least some example embodiments, the first magnetic tunnel junction structure and the second magnetic tunnel junction structure may have a same layer structure. The layer structure may include a pinned magnetic layer, a free magnetic layer, and a tunnel barrier layer between the pinned magnetic layer and the free magnetic layer.

The second magnetic tunnel juncture structure may be configured to be set in an irreversible dielectric breakdown state.

The first magnetic tunnel junction structure may include: a first pinned layer having a first pinned magnetization direction; a first tunnel barrier layer on the first pinned layer; and a first free layer on the first tunnel barrier layer, the first free layer having a first variable magnetization direction. The second magnetic tunnel junction structure may include: a second pinned layer having a second pinned magnetization direction; a second tunnel barrier layer on the second pinned layer, the second tunnel barrier layer set in the irreversible dielectric breakdown state; and a second free layer on the second tunnel barrier layer, the second free layer having a second variable magnetization direction.

According to at least some example embodiments, the device may further include: a first peripheral circuit including a plurality of first transistors, the first peripheral circuit configured to apply a first voltage to the first magnetic memory cells; and a second peripheral circuit including a plurality of second transistors, the second peripheral circuit configured to apply a second voltage to the second magnetic memory cells. The plurality of second transistors may have a threshold voltage greater than a threshold voltage of the plurality of first transistors, and the second voltage may be greater than the first voltage.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
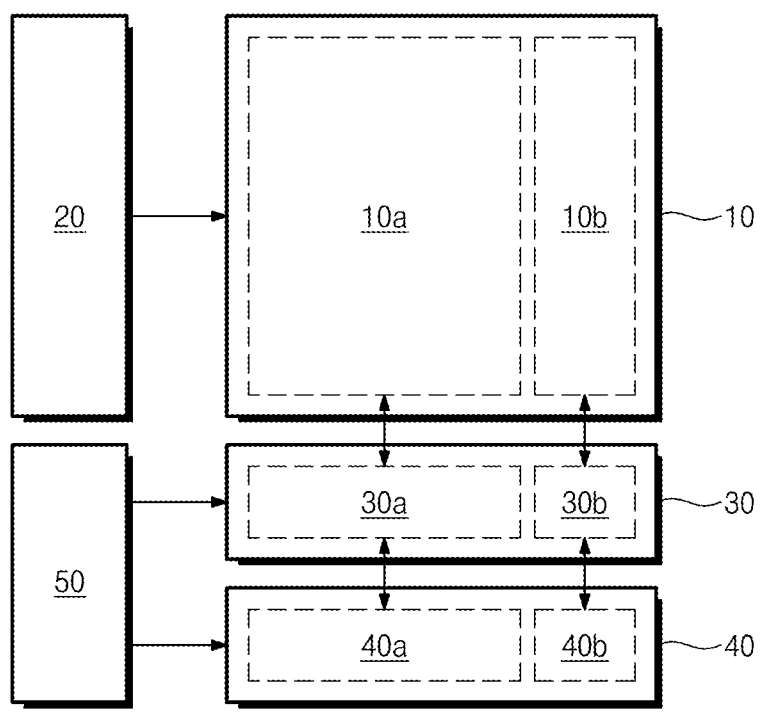
FIG. 1 is a block diagram illustrating a magnetic memory device according to some example embodiments of inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various example embodiments will be described more fully hereinafter with reference to the accompanying drawings, in which some example embodiments are shown. The example embodiments may, however, be embodied in many different forms and should not be construed as limited to the example embodiments set forth herein. Rather, these example embodiments are provided so that this description will be thorough and complete, and will fully convey the scope of the example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this example embodiment belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Units, controllers and/or devices (e.g., row decoder 20, column selection circuit 30, read/write circuit 40, and control logic 50, etc. discussed in more detail below) according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units, controllers and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Example embodiments of inventive concepts explained and illustrated herein include their complementary counterparts. The same reference numerals or the same reference designators denote the same elements throughout the specification.

FIG. 1 is a block diagram illustrating a magnetic memory device according to some example embodiments of inventive concepts.

Referring to FIG. 1, a magnetic memory device may include a memory cell array 10, which is configured to store data input from the outside, and a peripheral circuit, which is configured to control the memory cell array 10. The memory cell array 10 may include a normal cell array (also referred to herein as a reprogrammable cell array) 10a and a one-time-programmable (OTP) cell array 10b. In other words, for example, a part of the memory cell array 10 may be used as the normal cell array 10a, and the other part of the memory cell array 10 may be used as the OTP cell array 10b. The peripheral circuit may include a row decoder 20, a column selection circuit 30, a read/write circuit 40, and a control logic 50.

Each of the normal cell array 10a and the OTP cell array 10b may include a plurality of memory cells, each of which includes at least one memory device and at least one selection element. The memory cells of the normal cell array 10a may be rewritable memory cells, and the memory cells of the OTP cell array 10b may be one-time programmable memory cells. The memory cells of the normal cell array 10a and the OTP cell array 10b may be connected to word lines and bit lines. Hereinafter, for the sake of brevity, the memory cells of the normal cell array 10a will be referred to as 'normal memory cells' and the memory cells of the OTP cell array 10b will be referred to as 'OTP memory cells'. In addition, the bit lines connected to the normal memory cells will be referred to as 'first bit lines', and the bit lines connected to the 'OTP memory cells will be referred to as 'second bit lines'.

The row decoder 20 may be connected to the normal cell array 10a and the OTP cell array 10b through the word lines. The row decoder 20 may be configured to decode address information transmitted from the outside and select one of the word lines, based on the decoded address information.

Each of the column selection circuit 30 and the read/write circuit 40 may be divided into two regions, which are associated with the normal cell array 10a and the OTP cell array 10b, respectively. In other words, for example, the column selection circuit 30 may include a first column selection circuit 30a electrically connected to the normal memory cells and a second column selection circuit 30b electrically connected to the OTP memory cells. Similarly, the read/write circuit 40 may include a first read/write circuit 40a electrically connected to the normal memory cells and a second read/write circuit 40b electrically connected to the OTP memory cells.

In more detail, for example, the first column selection circuit 30a may be connected to the normal cell array 10a through first bit lines and may be configured to decode the address information transmitted from the outside and select one of a plurality of first bit lines, based on the decoded address information. The first bit line selected by the first column selection circuit 30a may be connected to the first read/write circuit 40a. The second column selection circuit 30b may be connected to the OTP cell array 10b through second bit lines and may be configured to decode the address information transmitted from the outside and select one of a plurality of second bit lines, based on the decoded address information. The second bit line selected by the second column selection circuit 30b may be connected to the second read/write circuit 40b.

Under control of the control logic 50, the first read/write circuit 40a may be configured to provide a first bit line bias for accessing selected ones of the normal memory cells. For example, the first read/write circuit 40a may be configured to provide a first bit line voltage to a selected first bit line, and here, the first bit line voltage may be used to perform a read or write operation on the selected ones of the normal memory cells. The first read/write circuit 40a may include a first write driver and a first sense amplifier. Under control of the control logic 50, the second read/write circuit 40b may be configured to provide a second bit line bias for accessing at least one selected from the OTP memory cells. For example, the second read/write circuit 40b may be configured to provide a second bit line voltage to a selected second bit line, and here, the second bit line voltage may be used to perform a read or write operation on the selected one of the OTP memory cells. The second read/write circuit 40b may include a second write driver and a second sense amplifier.

The control logic 50 may be configured to output control signals for controlling the magnetic memory device, in response to command signals input from the outside. The control signals may be used to control the read/write circuit 40.

Figure 2:
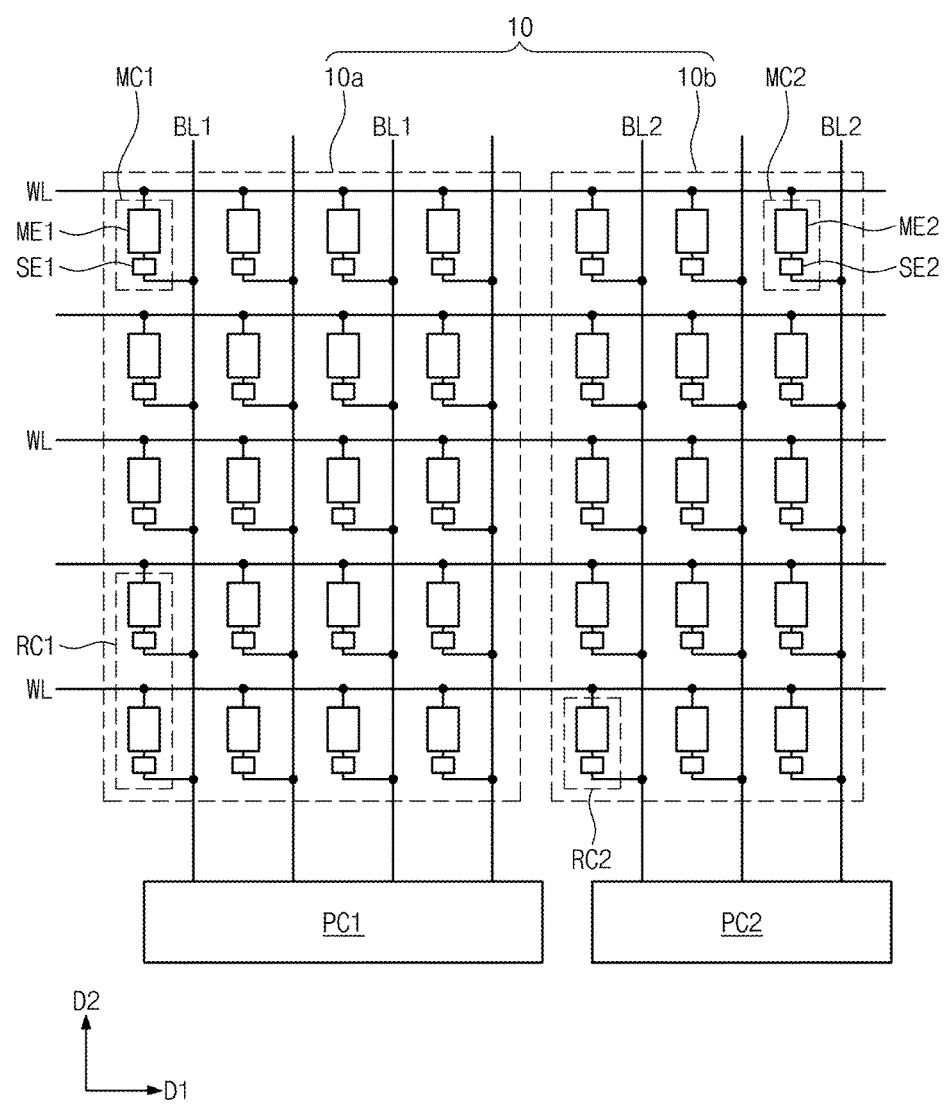
FIG. 2 is a circuit diagram illustrating a portion of a magnetic memory device according to some example embodiments of inventive concepts.

FIG. 2 is a circuit diagram illustrating a portion of a magnetic memory device according to some example embodiments of inventive concepts.

Referring to FIG. 2, a magnetic memory device may include a plurality of word lines WL, a plurality of bit lines, a memory cell array 10, a first peripheral circuit PC1, and a second peripheral circuit PC2. The memory cell array 10 may include a first memory cell array 10a and a second memory cell array 10b that are sequentially arranged in a first direction D1. The first memory cell array 10a may correspond to the normal cell array 10a of FIG. 1, and the second memory cell array 10b may correspond to the OTP cell array 10b of FIG. 1. Here, the first direction D1 may be selected to be parallel or substantially parallel to the word lines WL. A second direction D2 may be selected to cross the first direction D1 or be parallel or substantially parallel to the bit lines. The word lines WL may extend in the first direction D1 to cross the first memory cell array 10a and the second memory cell array 10b. The bit lines may be arranged to cross the word lines WL. The bit lines may include first bit lines BL1 connected to the first memory cell array 10a and second bit lines BL2 connected to the second memory cell array 10b.

The first memory cell array 10a may include first memory cells MC1. The first memory cells MC1 may be two- or three-dimensionally arranged. The first memory cells MC1 may be provided between and connected to the word lines WL and the first bit lines BL1. The first memory cells MC1 may correspond to the normal memory cells described with reference to FIG. 1. The second memory cell array 10b may include second memory cells MC2. The second memory cells MC2 may be two- or three-dimensionally arranged. The second memory cells MC2 may be provided between and connected to the word lines WL and the second bit lines BL2. The second memory cells MC2 may correspond to the OTP memory cells described with reference to FIG. 1. A plurality of first memory cells MC1 and a plurality of second memory cells MC2 may be connected in common to each of the word lines WL. Also, a plurality of first memory cells MC1 constituting each column may be respectively connected to different ones of the word lines WL and may share a corresponding one of the first bit lines BL1. Similarly, a plurality of second memory cells MC2 constituting each column may be respectively connected to different ones of the word lines WL and may share a corresponding one of the second bit lines BL2.

Each of the first memory cells MC1 may include a first memory element ME1 and a first selection element SE1. The first memory element ME1 may be provided between and connected to the first bit line BL1 and the first selection element SE1, and the first selection element SE1 may be provided between and connected to the first memory element ME1 and the word line WL. The first memory element ME1 may be a variable resistance device whose resistance may be switched to one of at least two states by an electric pulse applied thereto. In at least some example embodiments, the first memory element ME1 may have a layered structure, whose electric resistance may be changed by a spin transfer process using an electric current passing there through. For example, the first memory element ME1 may have a layered structure configured to exhibit a magneto-resistance property and may include at least one ferromagnetic material and/or at least one antiferromagnetic material. In at least some example embodiments, the first memory element ME1 may include a magnetic tunnel junction.

The first selection element SE1 may be configured to control a current flow of electric charges passing through the first memory element ME1. For example, the first selection element SE1 may be one of a diode, a pnp bipolar transistor, an npn bipolar transistor, an NMOS (n-channel metal-oxide-semiconductor) field effect transistor (FET), and a PMOS (p-channel metal-oxide-semiconductor) FET. In the case that the first selection element SE1 is a three-terminal switching device (e.g., a bipolar transistor or a MOSFET), an additional line (e.g., a source line) (not shown) may be connected to the first selection element SE1. An example embodiment of the first memory cell MC1 will be described in more detail with reference to FIGS. 3, 4A, and 4B.

The second memory cells MC2 may be provided to have a structure similar to, or the same as, the first memory cells MC1. For example, each of the second memory cells MC2 may include a second memory element ME2, which is provided in the form of magnetic tunnel junction, and a second selection element SE2, which configured to have substantially the same structure as the first selection element SE1. However, some of the second memory elements ME2 may be in a blown state and the others may be in an un-blown state. Here, the blown state means that a short circuit is formed between two magnetic layers of each second memory element ME2. For example, in the case where a one-time programming operation is performed to apply a voltage, which is higher than a breakdown voltage, to two magnetic layers, a dielectric breakdown phenomenon may occur in the tunnel barrier layer, and thus, the second memory element ME2 may become in the blown state. The dielectric breakdown phenomenon of the tunnel barrier layer may be irreversible, and electric resistance of the blown magnetic tunnel junction may be smaller than that of the un-blown magnetic tunnel junction. In sum, since some of the second memory elements ME2 may be set in the irreversible resistance state, the second memory cell array 10b may be used to realize an OTP memory device. Hereinafter, for the sake of brevity, the second memory cell MC2, whose the second memory element ME2 is in the un-blown state, will be referred to as a first sub cell (e.g., MC2_1 of FIG. 5A), whereas the second memory cell MC2, whose the second memory element ME2 is in the blown state, will be referred to as a second sub cell (e.g., MC2_2 of FIG. 5B). Example embodiments of the first and second sub cells MC2_1 and MC2_2 will be described in more detail with reference to FIGS. 5A and 5B.

Each of the first memory cells MC1 may be connected to the first peripheral circuit PC1 through a corresponding one of the first bit lines BL1, and each of the second memory cells MC2 may be connected to the second peripheral circuit PC2 through a corresponding one of the second bit lines BL2. The first peripheral circuit PC1 may include the first column selection circuit 30a and/or the first read/write circuit 40a of FIG. 1. The second peripheral circuit PC2 may include the second column selection circuit 30b and/or the second read/write circuit 40b of FIG. 1. According to at least some example embodiments of inventive concepts, the first peripheral circuit PC1 may include first peripheral transistors, which are low voltage transistors. The second peripheral circuit PC2 may include second peripheral transistors, and at least one of the second peripheral transistors may be a high voltage transistor, whose threshold voltage is higher than that of the first peripheral transistors. This may make it possible to allow a high voltage to be more stably applied to some of the second memory cells MC2, which are realized using the second sub cells MC2_2.

Some of the first memory cells MC1 may be used as a reference cell, when a reading operation is performed on the first memory cell array 10a. Similarly, some of the second memory cells MC2 may be used as a reference cell, when a reading operation is performed on the second memory cell array 10b. Hereinafter, a reference cell of the first memory cell array 10a will be referred to as a first reference cell RC1, and a reference cell of the second memory cell array 10b will be referred to as a second reference cell RC2.

In at least some example embodiments, the first reference cell RC1 may be provided between and connected to an adjacent pair of the word lines WL and one of the first bit lines BL1 crossing them. For example, the first reference cell RC1 may include a pair of first memory elements, which are connected in parallel to the first bit line BL1, and a pair of first selection elements SE1, which are respectively connected in series to the pair of first memory elements. But, inventive concepts should not be limited thereto. The first reference cell RC1 may be provided in plural. For example, a plurality of first reference cells RC1 may be provided between and connected to an adjacent pair of the word lines WL and the first bit lines BL1 crossing them. An example embodiment of the first reference cell RC1 will be described again with reference to FIG. 6.

The second reference cell RC2 may be realized using the second sub cell MC2_2. In other words, for example, the second reference cell RC2 may include the second memory element ME2 in the blown state. The second reference cell RC2 may be provided in plural, and the plurality of second reference cells RC2 may be arranged in the second direction D2, thereby constituting a column. A plurality of second reference cells RC2 constituting each column may be connected to different ones of the word lines WL and may share a corresponding one of the second bit lines BL2. The second reference cell RC2 will be described again with reference to FIG. 7A.

Figure 3:
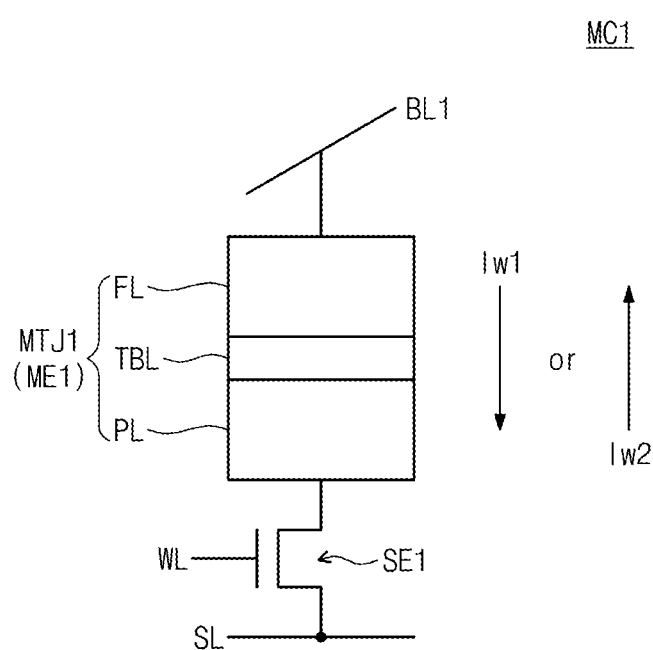
FIG. 3 is a diagram schematically illustrating a first memory cell according to some example embodiments of inventive concepts.

FIG. 3 is a diagram schematically illustrating a first memory cell according to some example embodiments of inventive concepts.

Referring to FIG. 3, the first memory cell MC1 may include a first magnetic tunnel junction MTJ1 serving as a memory device and a first selection transistor SE1 serving as a selection element. A gate electrode of the first selection transistor SE1 may be connected to a corresponding one of the word lines WL, a source electrode of the first selection transistor SE1 may be connected to a corresponding one of source lines SL, and a drain electrode of the first selection transistor SE1 may be connected to a corresponding one of the first bit lines BL1 through the first magnetic tunnel junction MTJ1.

The first magnetic tunnel junction MTJ1 may include a pinned layer PL, a free layer FL, and a tunnel barrier layer TBL interposed therebetween. The pinned layer PL may be configured to have a fixed magnetization direction, and the free layer FL may be configured to have a switchable magnetization direction (e.g., parallel or antiparallel to that of the pinned layer PL). The first magnetic tunnel junction MTJ1 may have electric resistance that is dependent on relative magnetization directions of the pinned and free layers PL and FL. In the case where the pinned and free layers PL and FL of the first magnetic tunnel junction MTJ1 have magnetization directions parallel to each other, the first magnetic tunnel junction MTJ1 may have a low resistance state (e.g., with a first resistance R1) or a state of data '0' corresponding to a first data. Alternatively, in the case where the pinned and free layers PL and FL of the first magnetic tunnel junction MTJ1 have magnetization directions antiparallel to each other, the first magnetic tunnel junction MTJ1 may have a high resistance state (e.g., with a second resistance R2) or a state of data '1' corresponding to a second data. For example, the first resistance R1 may be about 10 k$\Omega$, and the second resistance R2 may be about 40 k$\Omega$.

When a write operation is performed on the first memory cell MC1, a turn-on voltage may be applied to the word line WL and a first write voltage may be applied between both ends of the first magnetic tunnel junction MTJ1. Depending on polarity of the first write voltage applied to the first magnetic tunnel junction MTJ1, a first write current Iw1 or a second write current Iw2 may flow through the first magnetic tunnel junction MTJ1. The first write current Iw1 may flow through the first magnetic tunnel junction MTJ1 in a direction from the first bit line BL1 toward the source line SL, and the second write current Iw2 may flow through the first magnetic tunnel junction MTJ1 in a direction from the source line SL toward the first bit line BL1. A magnetization direction of the free layer FL may be changed using a spin torque phenomenon of electric charges constituting the write current. In sum, by changing a direction of the write current passing through the first magnetic tunnel junction MTJ1, it is possible to reversibly change electric resistance of the first memory cell MC1 to one of the first and second resistances R1 and R2, and thus, the first memory cell MC1 may serve as a normal memory cell whose data may be changed several times.

As shown in FIG. 3, the free layer FL and the pinned layer PL may be connected to the first bit line BL1 and the first selection transistor SE1, respectively, but inventive concepts should not be limited thereto. In at least some example embodiments, although not illustrated, the pinned layer PL may be connected to the first bit line BL1, and the free layer FL may be connected to the first selection transistor SE1.

Hereinafter, the first magnetic tunnel junction MTJ1 will be described in more detail with reference to FIGS. 4A and 4B.

Figure 4A:
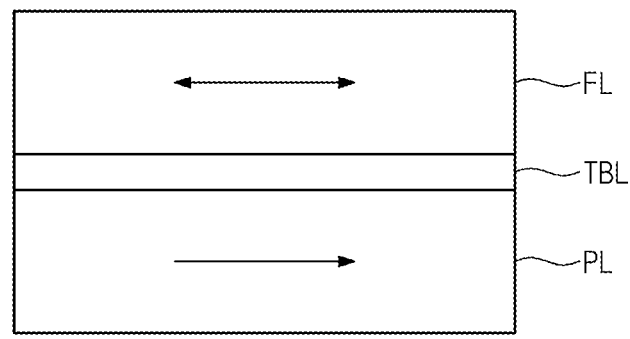
FIGS. 4A and 4B are schematic diagrams illustrating two different types of a first magnetic tunnel junction according to some example embodiments of inventive concepts.
Figure 4B:
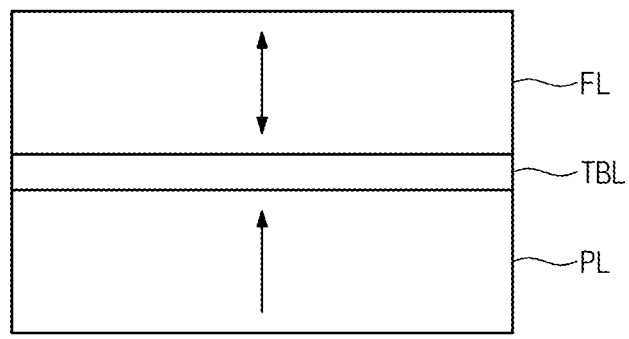

FIGS. 4A and 4B are schematic diagrams illustrating two different types of a first magnetic tunnel junction according to some example embodiments of inventive concepts.

Electric resistance of the first magnetic tunnel junction MTJ1 may be dependent on relative magnetization directions of the pinned and free layers PL and FL. For example, the electric resistance of the first magnetic tunnel junction MTJ1 may be greater (e.g., much or substantially greater) when magnetization directions of the pinned and free layers PL and FL are antiparallel to each other than when they are parallel to each other. As a result, the electric resistance of the first magnetic tunnel junction MTJ1 may be controlled by changing a magnetization direction of the free layer FL, and this may be used as data storing mechanism in the magnetic memory device according to some example embodiments of inventive concepts.

Referring to FIG. 4A, the pinned and free layers PL and FL may be configured to have an in-plane magnetization structure; for example, each of them may be or include at least one magnetic layer, whose magnetization direction is substantially parallel to a top surface of the tunnel barrier layer TBL. In this case, the pinned layer PL may include a layer containing an anti-ferromagnetic material and another layer containing a ferromagnetic material. In at least some example embodiments, the layer containing an anti-ferromagnetic material may include at least one of PtMn, IrMn, MnO, MnS, MnTe, $MnF_2$, $FeCl_2$, FeO, $CoCl_2$, CoO, $NiCl_2$, NiO, or Cr. In at least some example embodiments, the layer containing an anti-ferromagnetic material may include at least one of precious metals. The precious metals may include ruthenium (Ru), rhodium (Rh), palladium (Pd), osmium (Os), iridium (Ir), platinum (Pt), gold (Au), or silver (Ag). By contrast, the layer containing a ferromagnetic material may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The free layer FL may be configured to have a variable or switchable magnetization direction. The free layer FL may include a ferromagnetic material. As an example, the free layer FL may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The free layer FL may include a plurality of layers. As an example, the free layer FL may include a plurality of ferromagnetic layers and a non-magnetic layer interposed between the ferromagnetic layers. In this case, the ferromagnetic layers and the non-magnetic layer may constitute a synthetic antiferromagnetic structure. The presence of the synthetic antiferromagnetic structure may allow the magnetic memory device to have a reduced critical current density and/or improved thermal stability.

The tunnel barrier layer TBL may include at least one of magnesium oxide, titanium oxide, aluminum oxide, magnesium-zinc oxide, magnesium-boron oxide, titanium nitride, or vanadium nitride. As an example, the tunnel barrier layer TBL may be a single layer of magnesium oxide (MgO). Alternatively, the tunnel barrier layer TBL may include a plurality of layers. The tunnel barrier layer TBL may be formed using a chemical vapor deposition (CVD) process.

Referring to FIG. 4B, the pinned and free layers PL and FL may be configured to have a perpendicular magnetization structure; for example, each of them may be or include at least one magnetic layer, whose magnetization direction is normal or substantially normal to the top surface of the tunnel barrier layer TBL. In at least some example embodiments, each of the pinned and free layers PL and FL may include at least one of materials with an $L1_0$ crystal structure, materials having the hexagonal closed packed (HCP) structure, or amorphous rare-earth transition metal (RE-TM) alloys. As an example, each of the pinned and free layers PL and FL may include at least one of $L1_0$ materials, such as $Fe_{50}Pt_{50}$, $Fe_{50}Pd_{50}$, $Co_{50}Pt_{50}$, $Co_{50}Pd_{50}$, and $Fe_{50}Ni_{50}$. In at least some example embodiments, each of the pinned and free layers PL and FL may include at least one of disordered HCP cobalt-platinum (CoPt) alloys containing about 10 to about 45 at. % platinum or ordered HCP $Co_3Pt$ alloys. In at least some example embodiments, each of the pinned and free layers PL and FL may include at least one of the amorphous RE-TM alloys containing at least one of iron (Fe), cobalt (Co), or nickel (Ni) and at least one of rare-earth metals such as terbium (Tb), dysprosium (Dy), and gadolinium (Gd).

At least one of the pinned and free layers PL and FL may include a material with an interface perpendicular magnetic anisotropy. The interface perpendicular magnetic anisotropy may refer to a perpendicular magnetization phenomenon, which may be seen at an interface of a magnetic layer with an intrinsically in-plane magnetization property, when the magnetic layer is provided adjacent to or in contact with another layer. Here, the term "intrinsic in-plane magnetization property" will be used to mean that a magnetization direction of a magnetic layer is oriented parallel or substantially parallel to a longitudinal direction thereof, when there is no external magnetic field applied thereto. For example, in the case that a magnetic layer with the intrinsic in-plane magnetization property is formed on a substrate and there is no external magnetic field applied thereto, a magnetization direction of the magnetic layer may be oriented parallel or substantially parallel to the top surface of the substrate.

As an example, each of the pinned and free layers PL and FL may include at least one of cobalt (Co), iron (Fe), or nickel (Ni). In addition, each of the pinned and free layers PL and FL may further include at least one of non-magnetic materials including boron (B), zinc (Zn), aluminum (Al), titanium (Ti), ruthenium (Ru), tantalum (Ta), silicon (Si), silver (Ag), gold (Au), copper (Cu), carbon (C), and nitrogen (N). As an example, each of the pinned and free layers PL and FL may include a layer of CoFe or NiFe, in which boron (B) is added. Furthermore, at least one of the pinned and free layers PL and FL may further include at least one of titanium (Ti), aluminum (Al), magnesium (Mg), tantalum (Ta), or silicon (Si) to lower saturation magnetization thereof.

Figure 5A:
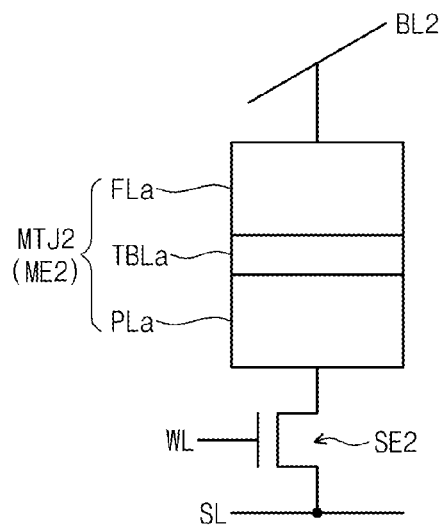
FIGS. 5A and 5B are diagrams schematically illustrating a first sub cell and a second sub cell according to some example embodiments of inventive concepts.
Figure 5B:
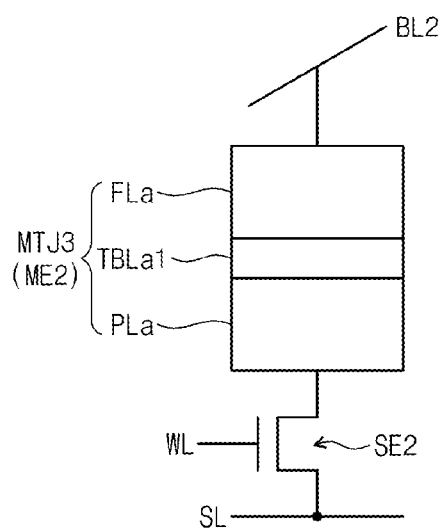

FIGS. 5A and 5B are diagrams schematically illustrating a first sub cell and a second sub cell according to some example embodiments of inventive concepts.

Referring to FIG. 5A, a first sub cell MC2-1 may include a second magnetic tunnel junction MTJ2 serving as a memory device and a second selection transistor SE2 serving as a selection element. A gate electrode of the second selection transistor SE2 may be connected to a corresponding one of the word lines WL, a source electrode of the second selection transistor SE2 may be connected to a corresponding one of the source lines SL, and a drain electrode of the second selection transistor SE2 may be connected to a corresponding one of the second bit lines BL2 through the second magnetic tunnel junction MTJ2. The second magnetic tunnel junction MTJ2 may include a pinned layer PLa, a free layer FLa, and a tunnel barrier layer TBLa interposed therebetween. The pinned layer PLa, the free layer FLa, and the tunnel barrier layer TBLa of the second magnetic tunnel junction MTJ2 may be formed of the same or substantially the same materials as the pinned layer PL, the free layer FL, and the tunnel barrier layer TBL of the first magnetic tunnel junction MTJ1. In other words, for example, the second magnetic tunnel junction MTJ2 may be or include a variable resistance device whose resistance may be switched to one of at least two states by an electric pulse applied thereto.

Referring to FIG. 5B, a second sub cell MC2-2 may be similar to or substantially the same as the first sub cell MC2-1, except that a third magnetic tunnel junction MTJ3 is used as a memory device thereof. The third magnetic tunnel junction MTJ3 may include the pinned layer PLa, the free layer FLa, and a tunnel barrier layer TBLa1 interposed therebetween. The pinned layer PLa, the free layer FLa, and the tunnel barrier layer TBLa1 of the third magnetic tunnel junction MTJ3 may be formed of the same or substantially the same materials as the pinned layer PL, the free layer FL, and the tunnel barrier layer TBL of the first magnetic tunnel junction MTJ1 and/or the pinned layer PLa, the free layer FLa, and the tunnel barrier layer TBLa of the second magnetic tunnel junction MTJ2. Here, the tunnel barrier layer TBLa1 may be in a dielectric breakdown state or in a blown state. Accordingly, the third magnetic tunnel junction MTJ3 may have an irreversible resistance.

According to at least some example embodiments, a one-time programming operation may be performed to realize OTP memory cells. In the one-time programming operation, a second write voltage may be applied to some of the second memory cells MC2 realized using the first sub cells MC2-1, and a third write voltage may be applied to others of the second memory cells MC2 realized using the second sub cells MC2-2. In other words, for example, the second write voltage may be applied to both ends of the second magnetic tunnel junction MTJ2, and the third write voltage may be applied to both ends of the third magnetic tunnel junction MTJ3. Here, the second write voltage may be the same or substantially the same as the first write voltage applied to both ends of the first magnetic tunnel junction MTJ1, but the third write voltage may be greater (e.g., much or substantially greater) than the first write voltage. For example, the third write voltage may be selected to be greater than a breakdown voltage of the third magnetic tunnel junction MTJ3. Accordingly, the tunnel barrier layer TBLa1 of the third magnetic tunnel junction MTJ3 may be broken down. Meanwhile, a programming operation on the second memory cells MC2 may be performed in advance before a process of packaging the magnetic memory device. The second magnetic tunnel junction MTJ2 may be programmed to have one of the first and second resistances R1 and R2, depending on a direction of the second write voltage (e.g., a direction of a write current passing through the second magnetic tunnel junction MTJ2). However, in the case where a subsequent thermal process (e.g., a packaging process and/or an annealing process) is performed on the magnetic memory device, the resistance of the second magnetic tunnel junction MTJ2 may be changed. For example, a final resistance of the second magnetic tunnel junction MTJ2 may have a third resistance R3 between the first and second resistances R1 and R2.

As a result of the above-described one-time programming operation, the second magnetic tunnel junction MTJ2 may have the third resistance R3 corresponding to the data '1' state or the second data. Here, the third resistance R3 may be between the first resistance R1 and the second resistance R2. The third magnetic tunnel junction MTJ3 in the blown state may have a fourth resistance R4 that is smaller (e.g., much or substantially smaller) than the first resistance R1 and corresponds to the data '0' state or the first data. For example, the fourth resistance R4 may be less than or equal to about 1 kΩ.

Figure 6:
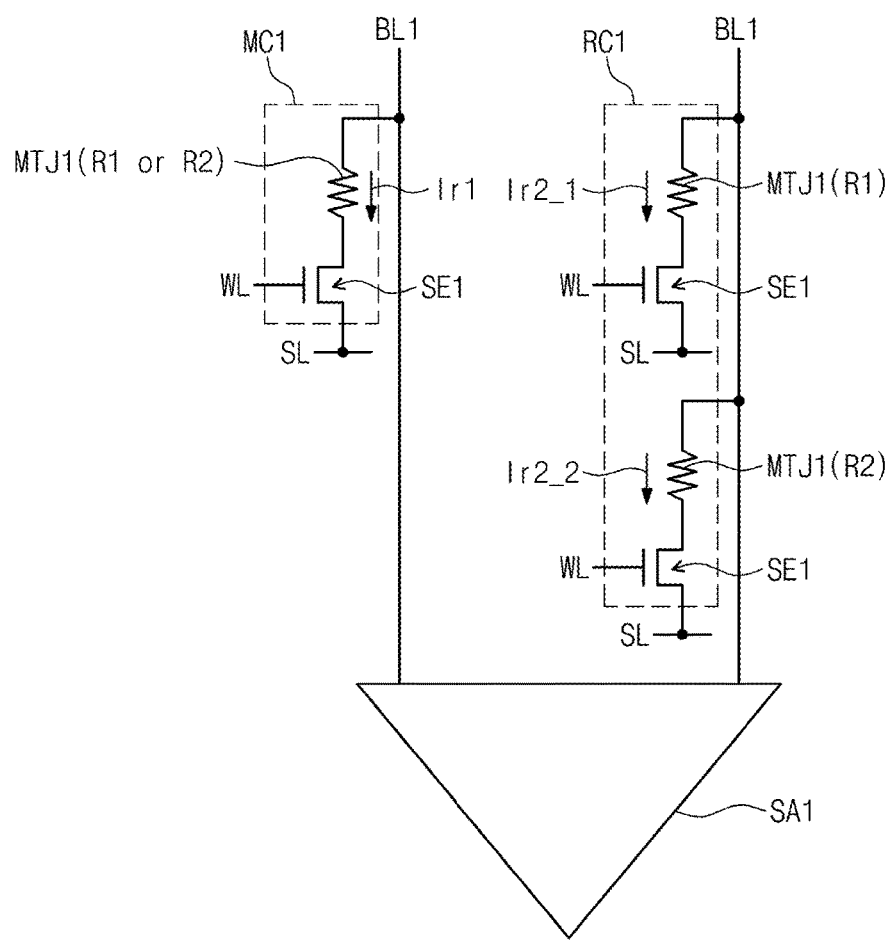
FIG. 6 is a schematic circuit diagram illustrating an example reading operation of a first memory cell according to some example embodiments of inventive concepts.

FIG. 6 is a schematic circuit diagram illustrating an example reading operation of a first memory cell according to some example embodiments of inventive concepts.

A data of the selected first memory cell MC1 may be determined from a difference in electric resistance between the selected first memory cell MC1 and the first reference cell RC1. Referring to FIG. 6, the first reference cell RC1 may include a pair of first magnetic tunnel junctions MTJ1 connected in parallel to the first bit line BL1 and a pair of the first selection transistors SE1 connected in series to the pair of first magnetic tunnel junctions MTJ1, respectively. The source lines SL respectively connected to the first selection transistors SE1 of the first reference cell RC1 may be electrically connected to each other. In at least some example embodiments, the first selection transistors SE1 of the first reference cell RC1 may have source electrodes sharing one of the source lines SL.

Before a reading operation, the first magnetic tunnel junctions MTJ1 of the first reference cell RC1 may be programmed to have resistances different from each other. For example, one of the first magnetic tunnel junctions MTJ1 of the first reference cell RC1 may be programmed to have a first resistance R1, and the other may be programmed to have a second resistance R2. In this case, the first reference cell RC1 may have a resistance of about (R1+R2)/2. An additional programming operation may be performed on the selected first memory cell MC1 to store data corresponding to the first resistance R1 or the second resistance R2 in the selected first memory cell MC1.

In the reading operation, a first read current Ir1 may be applied to flow through the first magnetic tunnel junction MTJ1 of the selected first memory cell MC1, while a turn-on voltage is applied to the word line WL of the selected first memory cell MC1. Second read currents Ir2_1 and Ir2_2 may be applied to flow through the first magnetic tunnel junctions MTJ1 of the first reference cell RC1, while the turn-on voltage is applied to the word line WL of the first reference cell RC1. A first sense amplifier SA1 may be configured to sense and amplify a difference between resistances of the first memory cell MC1 and the first reference cell RC1, which are respectively associated with the first read current Ir1 and the second read currents Ir2_1 and Ir2_2, and the result obtained by the first sense amplifier SA1 may be used to determine a state of data stored in the selected first memory cell MC1. In at least some example embodiments, the first sense amplifier SA1 may be a part of the first peripheral circuit PC1 described with reference to FIG. 2.

In the case where the free and pinned layers FL and PL of the first magnetic tunnel junction MTJ1 of the selected first memory cell MC1 have magnetization directions parallel to each other, the selected first memory cell MC1 may be interpreted to be in the data '0' state. Alternatively, in the case where the free and pinned layers FL and PL of the first magnetic tunnel junction MTJ1 of the selected first memory cell MC1 have magnetization directions anti-parallel to each other, the selected first memory cell MC1 may be interpreted to be in the data '1' state.

Figure 7A:
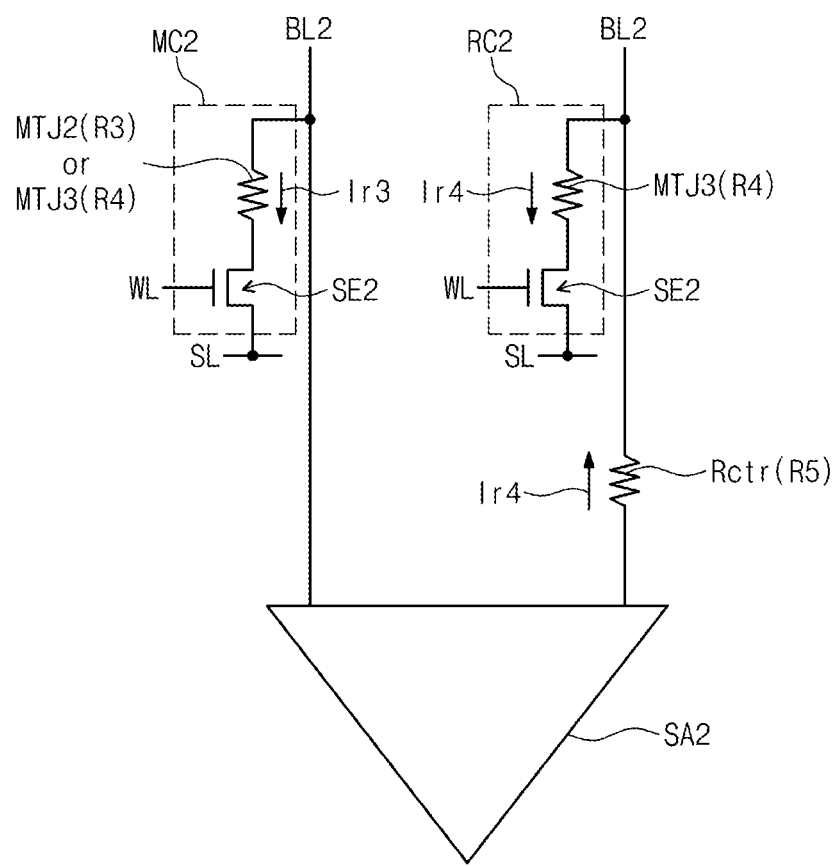
FIGS. 7A and 7B are schematic circuit diagrams illustrating an example reading operation of a second memory cell according to some example embodiments of inventive concepts.
Figure 7B:
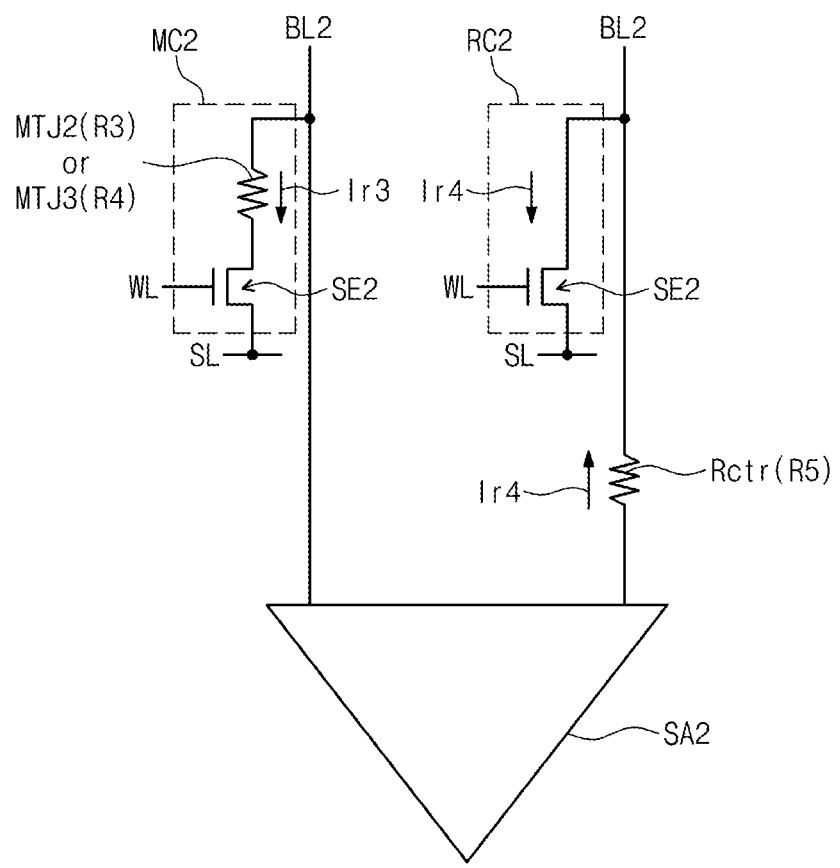

FIGS. 7A and 7B are schematic circuit diagrams illustrating an example reading operation of a second memory cell according to some example embodiments of inventive concepts.

Referring to FIG. 7A, the second reference cell RC2 may be selected from the second sub cells MC2_2. Accordingly, the second reference cell RC2 may include the third magnetic tunnel junction MTJ3 having the fourth resistance R4. A selected second memory cell MC2 may be the first sub cell MC2-1 or the second sub cell MC2-2. In other words, the selected second memory cell MC2 may include the second magnetic tunnel junction MTJ2 or the third magnetic tunnel junction MTJ3. Accordingly, the selected second memory cell MC2 may have electric resistance that is substantially the same or substantially the same as the third resistance R3 or the fourth resistance R4.

A data of the selected second memory cell MC2 may be determined from a difference in electric resistance between the selected second memory cell MC2 and the second reference cell RC2. Here, in order to increase a sensing margin, the second reference cell RC2 may be configured in such a way that its electric resistance is between the fourth resistance R4 and the third resistance R3. For this, a control resistor Rct may be provided on the second bit line BL2 or between the second reference cell RC2 and a second sense amplifier SA2. In other words, for example, the third magnetic tunnel junction MTJ3 of the second reference cell RC2 may be electrically connected to the control resistor Rct. Accordingly, in the reading operation, the second reference cell RC2 may have electric resistance that is the same or substantially the same as a sum of the fourth resistance R4 of the third magnetic tunnel junction MTJ3 and a fifth resistance R5 of the control resistor Rct (i.e., R4+R5). The sum of R4+R5 may be between the fourth resistance R4 and the third resistance R3 (e.g., about 7 kΩ). In at least some example embodiments, the second sense amplifier SA2 and the control resistor Rct may be a part of the second peripheral circuit PC2 described with reference to FIG. 2.

In the reading operation, a third read current Ir3 may be applied to flow through the second memory element (e.g., the second or third magnetic tunnel junction MJT2 or MTJ3) of the selected second memory cell MC2, while a turn-on voltage is applied to the word line WL of the selected second memory cell MC2. A fourth read current Ir4 may be applied to flow through the third magnetic tunnel junction MTJ3 of the second reference cell RC2 and the control resistor Rct, while the turn-on voltage is applied to the word line WL of the second reference cell RC2. The second sense amplifier SA2 may be configured to sense and amplify a difference between resistances of the second memory cell MC2 and the second reference cell RC2, which are respectively associated with the third read current Ir3 and the fourth read current Ir4, and the result obtained by the second sense amplifier SA2 may be used to determine a state of data stored in the selected second memory cell MC2.

When the selected second memory cell MC2 is the first sub cell MC2-1, the selected second memory cell MC2 may be interpreted to be in the data '1' state. Alternatively, when the selected second memory cell MC2 is the second sub cell MC2-2, the selected second memory cell MC2 may be interpreted to be in the data '0' state.

In at least some example embodiments, the structure of the second reference cell RC2 may be modified from that shown in FIG. 7A. For example, the third magnetic tunnel junction MTJ3 serving as a memory element may not be provided in the second reference cell RC2.

Referring to FIG. 7B, the second reference cell RC2 may include the second selection transistor SE2. In this case, the fifth resistance R5 of the control resistor Rct may be between the fourth resistance R4 and the third resistance R3. For example, the fifth resistance R5 of the control resistor Rct may be about 7 kΩ. In the reading operation, a third read current Ir3 may be applied to flow through the second memory element (e.g., the second or third magnetic tunnel junction MJT2 or MTJ3) of the selected second memory cell MC2, while a turn-on voltage is applied to the word line WL of the selected second memory cell MC2. The fourth read current Ir4 may be applied to flow through the control resistor Rct, the second bit line BL2 and the source line SL, which are connected to the second reference cell RC2, while a turn-on voltage is applied to the word line WL of the second reference cell RC2. The second sense amplifier SA2 may be configured to sense and amplify a difference between resistances of the second memory cell MC2 and the second reference cell RC2, which are respectively associated with the third read current Ir3 and the fourth read current Ir4, and the result obtained by the second sense amplifier SA2 may be used to determine a state of data stored in the selected second memory cell MC2.

An OTP memory device may be used to repair a semiconductor device. For example, the OTP memory device may be used to store information on operational characteristics of the semiconductor device that are obtained by performing a test process on the semiconductor device, and the information stored in the OTP memory device may be used to suppress and/or prevent malfunctioning of a semiconductor device. In addition, the OTP memory device may be used to store other information required to control the semiconductor device. For example, a semiconductor device may be fabricated to have physical and/or operational characteristics varying from position to position, and the OTP memory device may be configured to store information on such a positional variation of the semiconductor device. In this case, the information may be used to control a memory array of the semiconductor device.

According to at least some example embodiments of inventive concepts, since a part of a memory cell array is used to realize an OTP cell array, it may be unnecessary to form an addition region for the OTP memory device. This may make it possible to realize a more highly-integrated magnetic memory device. In addition, OTP memory cells may be more easily realized by a method of forming a short circuit in a magnetic tunnel junction serving as a memory element of a memory cell. Furthermore, by separately providing a reference cell and a peripheral circuit for the OTP memory cells, it is possible to improve and/or optimize read/write operations on the OTP memory cells. This may make it possible to realize a more highly-reliable magnetic memory device.

Figure 8A:
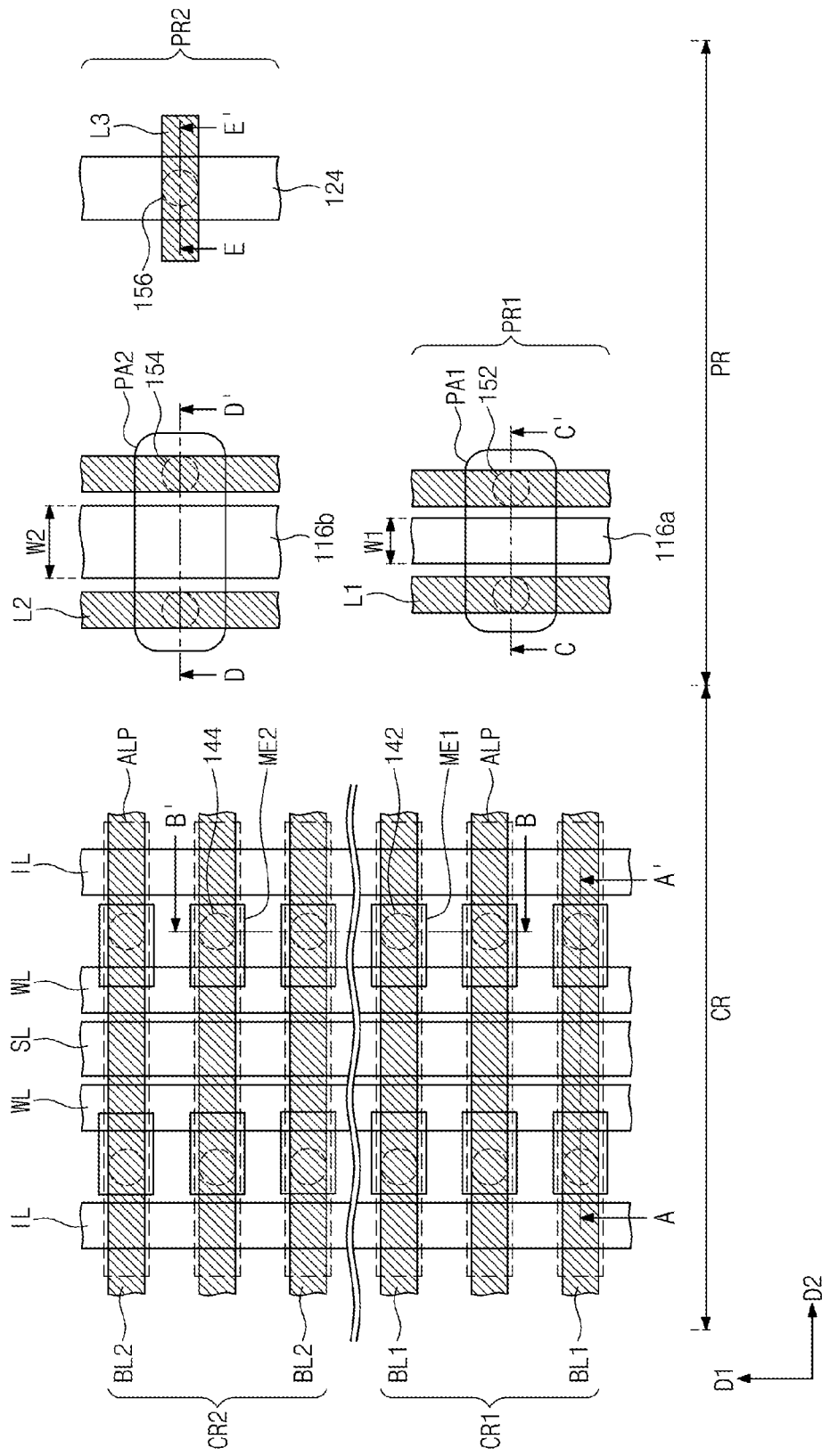
FIG. 8A is a plan view illustrating an example of a magnetic memory device according to some example embodiments of inventive concepts.
Figure 8B:
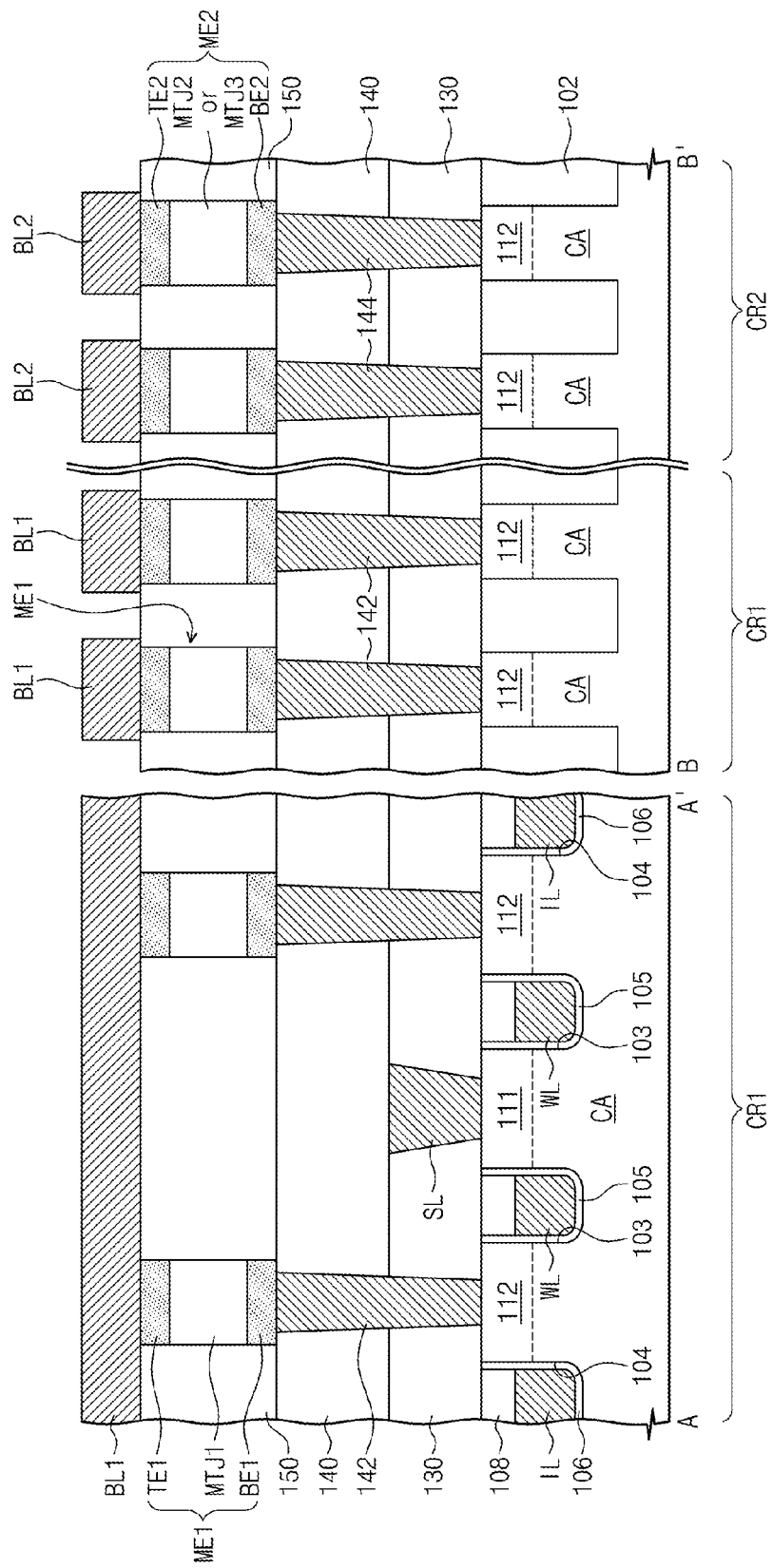
FIG. 8B is a sectional view taken along lines A-A' and B-B' of FIG. 8A.
Figure 8C:
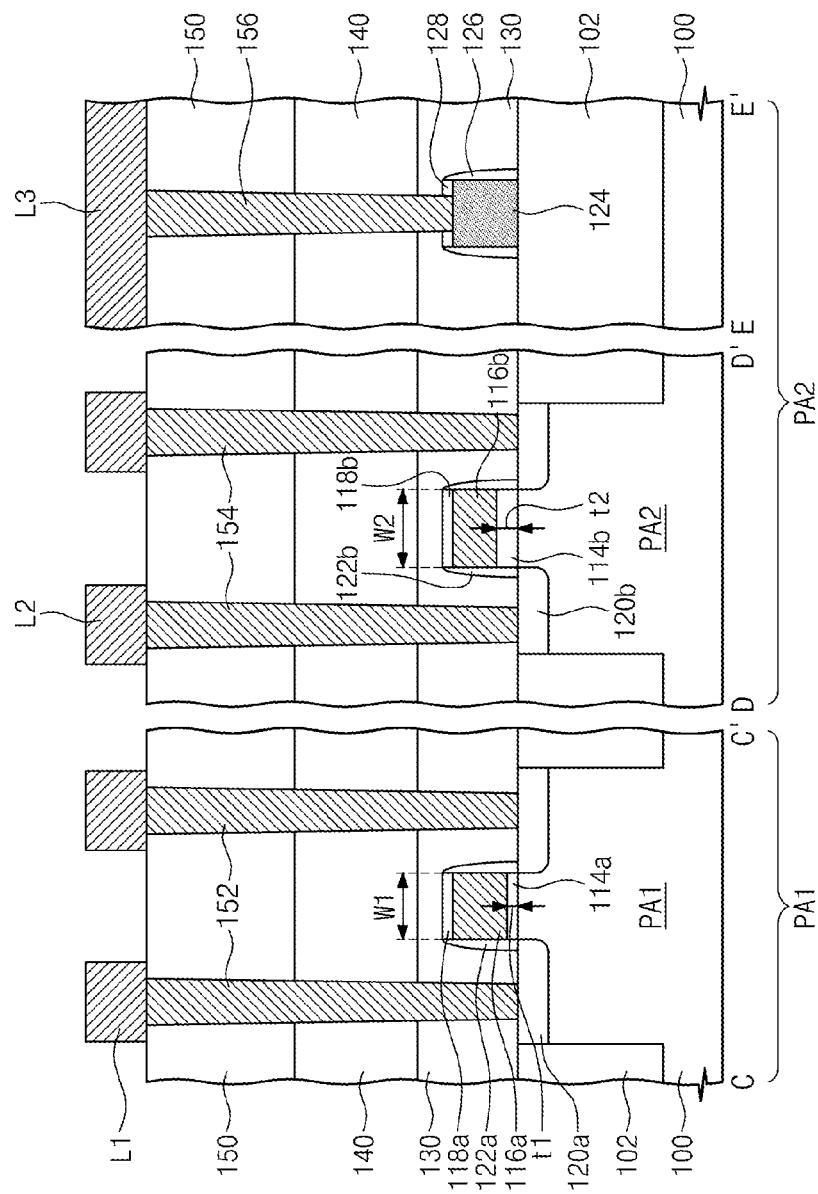
FIG. 8C is a sectional view taken along lines C-C', D-D', and E-E' of FIG. 8A.

FIG. 8A is a plan view illustrating an example of a magnetic memory device according to some example embodiments of inventive concepts. FIG. 8B is a sectional view taken along lines A-A' and B-B' of FIG. 8A. FIG. 8C is a sectional view taken along lines C-C', D-D', and E-E' of FIG. 8A.

Referring to FIGS. 8A to 8C, a substrate 100 including a cell array region CR and a peripheral circuit region PR may be provided. The substrate 100 may be a silicon wafer, a germanium wafer, and/or a silicon-germanium wafer, but inventive concepts should not be limited thereto. The cell array region CR may include a first cell array region CR1 and a second cell array region CR2. The first memory cell array 10a of FIG. 2 may be provided on the first cell array region CR1, and the second memory cell array 10b of FIG. 2 may be provided on the second cell array region CR2. The peripheral circuit region PR may include a first peripheral circuit region PR1 and a second peripheral circuit region PR2. The first peripheral circuit PC1 of FIG. 2 may be provided on the first peripheral circuit region PR1, and the second peripheral circuit PC2 of FIG. 2 may be provided on the second peripheral circuit region PR2.

Device isolation patterns 102 may be provided in the substrate 100. The device isolation patterns 102 of the first and second cell array regions CR1 and CR2 may define active line patterns ALP. The device isolation patterns 102 and the active line patterns ALP of the first and second cell array regions CR1 and CR2 may be arranged in the first direction D1. When viewed in a plan view, the device isolation patterns 102 and the active line patterns ALP of the first and second cell array regions CR1 and CR2 may extend in the second direction D2 crossing the first direction D1. The active line patterns ALP may be doped to have a first conductivity type.

A first peripheral active portion PA1 and a second peripheral active portion PA2 may be defined by the device isolation patterns 102, which are respectively provided on the first and second peripheral circuit regions PR1 and PR2. The first peripheral active portion PA1 and the second peripheral active portion PA2 may be doped to have the first conductivity type or a second conductivity type different from the first conductivity type.

On the first and second cell array regions CR1 and CR2, isolation recess regions 104 may be provided to cross the active line patterns ALP and the device isolation patterns 102. When viewed in a plan view, the isolation recess regions 104 may extend in the first direction D1 and may be shaped like a groove. The isolation recess regions 104 may divide each of the active line patterns ALP into a plurality of cell active portions CA. The cell active portions CA may be portions of the active line patterns ALP, which are positioned between the isolation recess regions 104. In other words, for example, each of the cell active portions CA may be defined by an adjacent pair of the device isolation patterns 102 and an adjacent pair of the isolation recess regions 104. When viewed in a plan view, the cell active portions CA may be two-dimensionally arranged in the first direction D1 and the second direction D2.

At least one gate recess region 103 may be provided to cross a plurality of the cell active portions CA, which are arranged in the first direction D1. The gate recess region 103 may extend parallel or substantially parallel to the isolation recess regions 104. In at least some example embodiments, at least one pair of the gate recess regions 103 may be provided to cross the cell active portions CA arranged in the first direction D1. In this case, a pair of cell transistors may be formed on the cell active portions CA, respectively. The cell transistor of the first cell array region CR1 may correspond to the first selection transistor SE1 described with reference to FIGS. 2 and 3, and the cell transistor of the second cell array region CR2 may correspond to the second selection transistor SE2 described with reference to FIGS. 2, 5A, and 5B.

The gate recess regions 103 may have bottom surfaces which are positioned at the same or substantially the same level as bottom surfaces of the isolation recess regions 104. The bottom surfaces of the gate and isolation recess regions 103 and 104 may be positioned at a level higher than that of the bottom surfaces of the device isolation patterns 102 of the first and second cell array regions CR1 and CR2.

The word lines WL may be disposed in the gate recess regions 103, respectively. A cell gate dielectric layer 105 may be disposed between the word line WL and an inner surface of each of the gate recess regions 103. Since the word line WL is disposed in the gate recess region 103, the word line WL may be a line-shaped structure extending in the first direction D1 or parallel to the gate recess region 103. The cell transistor may include the word line WL and a channel region recessed by the gate recess region 103.

Isolation lines IL may be disposed in the isolation recess regions 104, respectively. An isolation gate dielectric layer 106 may be disposed between the isolation line IL and an inner surface of each of the isolation recess regions 104. The isolation line IL may also be a line-shaped structure extending in the first direction D1.

Cell capping patterns 108 may be disposed on the word and isolation lines WL and IL, respectively. The cell capping patterns 108 may be disposed in the gate and isolation recess regions 103 and 104. The cell capping patterns 108 may have top surfaces which are coplanar or substantially coplanar with the top surface of the substrate 100.

When a magnetic memory device is operated, an isolation voltage may be applied to the isolation line IL. The isolation voltage may be selected to suppress and/or prevent a channel region from being formed below the isolation line IL or the isolation recess region 104. In other words, for example, by applying the isolation voltage to the isolation line IL, an isolation channel region under the isolation line IL may be in a non-conductive state. Accordingly, the cell active portions CA may be electrically separated from each other. In the case where the active line patterns ALP are of p-type, the isolation voltage may be a ground voltage or a negative voltage.

The word line WL may include at least one of, for example, doped semiconductor materials (e.g., doped silicon), metallic materials (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). In at least some example embodiments, the isolation line IL may be formed of the same or substantially the same material as the word line WL. The cell and isolation gate dielectric layers 105 and 106 may be formed of or include, for example, silicon oxide, silicon nitride, silicon oxynitride, and/or high-k dielectric materials including insulating metal oxides (e.g., hafnium oxide or aluminum oxide). The cell capping patterns 108 may be formed of or include at least one of silicon oxide, silicon nitride, or silicon oxynitride.

First and second impurity regions 111 and 112 may be provided in the cell active portions CA and between the word lines WL or between the word and isolation lines WL and IL. For example, the first impurity region 111 may be formed in the cell active portions CA between the word lines WL, and the second impurity regions 112 may be formed in the cell active portions CA between the word and isolation lines WL and IL. Accordingly, the first impurity region 111 may be shared by a pair of cell transistors, which are on each cell active portion CA. The first and second impurity regions 111 and 112 may correspond to the source/drain regions of the cell transistor. The first and second impurity regions 111 and 112 may be doped to have the second conductivity type. One of the first and second conductivity types may be an n-type, and the other may be a p-type.

A first peripheral gate dielectric layer 114a, a first peripheral gate electrode 116a, and a first peripheral capping pattern 118a may be sequentially stacked on the first peripheral active portion PA1 of the first peripheral circuit region PR1. First peripheral source/drain regions 120a may be provided in separate regions of the first peripheral active portion PA1, which are respectively located at both sides of the first peripheral gate electrode 116a. First peripheral gate spacers 122a may be disposed on both sidewalls of the first peripheral gate electrode 116a. The first peripheral source/drain regions 120a may be doped with dopants to have a conductivity type different from that the first peripheral active portion PA1. Unlike the cell transistor, the first peripheral transistor including the first peripheral gate electrode 116a may include a planar channel region. In other words, for example, the first peripheral transistor may be a planar-type transistor. But, inventive concepts should not be limited thereto. For example, in at least some example embodiments, the first peripheral gate electrode 116a may be provided to have an electrode structure for Fin-FET devices. The first peripheral transistor may be a PMOS or NMOS transistor.

A second peripheral gate dielectric layer 114b, a second peripheral gate electrode 116b, and a second peripheral capping pattern 118b may be sequentially stacked on the second peripheral active portion PA2 of the second peripheral circuit region PR2. Second peripheral source/drain regions 120b may be provided in separate regions of the second peripheral active portion PA2, which are respectively located at both sides of the second peripheral gate electrode 116b. Second peripheral gate spacers 122b may be disposed on both sidewalls of the second peripheral gate electrode 116b. The second peripheral source/drain regions 120b may be doped with dopants to have a conductivity type different from that of the second peripheral active portion PA2. The second peripheral transistor with the second peripheral gate electrode 116b may be provided to have the same or substantially the same shape as that of the first peripheral transistor. In other words, for example, the second peripheral transistor may be provided in the form of planar transistor. But, inventive concepts should not be limited thereto. In at least some example embodiments, the second peripheral gate electrode 116b may have the same or substantially the same structure as a gate electrode of a fin-FET device. The second peripheral transistor may be a PMOS or NMOS transistor.

In at least some example embodiments, the first peripheral transistor may be a low voltage transistor that is operated under a low operation voltage, and the second peripheral transistor may be a high voltage transistor that is operated under a high operation voltage. The second peripheral transistor may be provided to have a channel region that is longer than the first peripheral transistor, and this may make it possible to suppress and/or prevent a punch-through phenomenon from occurring in the second peripheral transistor. For example, a second width W2 of the second peripheral gate electrode 116b may be greater than a first width W1 of the first peripheral gate electrode 116a. In addition, a gate dielectric layer of the second peripheral transistor may be formed to be thicker than that of the first peripheral transistor, and this may make it possible to allow the second peripheral transistor to have an increased breakdown voltage. For example, break down of the gate dielectric layer of the second peripheral transistor may be suppressed and/or prevented, even when a large potential difference is applied between the second peripheral gate electrode 116b and the second peripheral source/drain regions 120b. In other words, for example, a second thickness t2 of the second peripheral gate dielectric layer 114b may be greater than a first thickness t1 of the first peripheral gate dielectric layer 114a.

Each of the first and second peripheral gate dielectric layers 114a and 114b may be formed of or include at least one of a silicon oxide layer and high-k dielectric layers containing metal oxides (e.g., hafnium oxide or aluminum oxide). In at least some example embodiments, the first peripheral gate dielectric layer 114a may be formed of a relatively thin silicon oxide layer, and the second peripheral gate dielectric layer 114b may be formed of a relatively thick silicon oxide layer. In at least some example embodiments, the first peripheral gate dielectric layer 114a may be a single high-k dielectric layer, and the second peripheral gate dielectric layer 114b may be a double layer including a silicon oxide layer and a high-k dielectric layer. The first and second peripheral gate electrodes 116a and 116b may be formed of or include at least one of, for example, doped semiconductor materials (e.g., doped silicon), metallic materials (e.g., tungsten, aluminum, titanium, and/or tantalum), conductive metal nitrides (e.g., titanium nitride, tantalum nitride, and/or tungsten nitride), or metal-semiconductor compounds (e.g., metal silicides). First and second peripheral capping patterns 118a and 118b may be formed of or include at least one of silicon oxide, silicon nitride, or silicon oxynitride. The first and second peripheral gate spacers 122a and 122b may be formed of or include at least one of silicon oxide, silicon nitride, or silicon oxynitride.

A resistance pattern 124 may be disposed on the device isolation pattern 102 of the second peripheral circuit region PR2. The resistance pattern 124 may include a semiconductor material. For example, the resistance pattern 124 may include silicon, germanium, or silicon-germanium. In at least some example embodiments, the resistance pattern 124 may include a polycrystalline semiconductor material. The resistance pattern 124 may be doped with n- or p-type dopants, and electric resistivity of the resistance pattern 124 may be controlled by changing a doping concentration of the resistance pattern 124. The entire portion of the resistance pattern 124 may be uniformly doped with the dopants. Alternatively, the resistance pattern 124 may be partially doped with the dopants. Insulating spacers 126 may be disposed on sidewalls of the resistance pattern 124, and a protection insulating pattern 128 may be disposed on a top surface of the resistance pattern 124. Each of the insulating spacers 126 and the protection insulating pattern 128 may be formed of or include at least one of silicon oxide, silicon nitride, or silicon oxynitride. The resistance pattern 124 may correspond to the control resistor Rct described with reference to FIGS. 7A and 7B.

A first interlayered dielectric layer 130 may be disposed on the substrate 100 of the cell array region CR and the peripheral circuit region PR. The first interlayered dielectric layer 130 of the first peripheral circuit region PR1 may cover the first peripheral transistor, and the first interlayered dielectric layer 130 of the second peripheral circuit region PR2 may cover the second peripheral transistor and the resistance pattern 124. The first interlayered dielectric layer 130 may be formed of or include at least one of silicon oxide, silicon nitride, or silicon oxynitride. The source lines SL may be provided to pass through the first interlayered dielectric layer 130 of the first and second cell array regions CR1 and CR2 and to be in contact with the substrate 100. The source lines SL may extend in the first direction D1. Each of the source lines SL may be electrically coupled to the first impurity regions 111, which are arranged along the first direction D1. The source lines SL may have top surfaces, which are coplanar or substantially coplanar with that of the first interlayered dielectric layer 130 of the first and second cell array regions CR1 and CR2. The source lines SL may include at least one of, for example, doped semiconductor materials (e.g., doped silicon), metallic materials (e.g., tungsten, aluminum, titanium, and/or tantalum), conductive metal nitrides (e.g., titanium nitride, tantalum nitride, and/or tungsten nitride), or metal-semiconductor compounds (e.g., metal silicide).

A second interlayered insulating layer 140 may be disposed on the first interlayered dielectric layer 130. The second interlayered insulating layer 140 may include at least one of silicon oxide, silicon nitride, or silicon oxynitride. On the first cell array region CR1, first contact plugs 142 may be provided to pass through both of the second and first interlayered dielectric layers 140 and 130. The first contact plugs 142 may be electrically coupled to the second impurity regions 112, respectively, of the first cell array region CR1. On the second cell array region CR2, second contact plugs 144 may be provided to pass through both of the second and first interlayered dielectric layers 140 and 130. The second contact plugs 144 may be electrically coupled to the second impurity regions 112, respectively, of the second cell array region CR2. In at least some example embodiments, the first and second contact plugs 142 and 144 may be formed of the same or substantially the same conductive material as the source line SL, but inventive concepts should not be limited thereto. The first and second contact plugs 142 and 144 may have top surfaces that are coplanar or substantially coplanar with that of the second interlayered insulating layer 140.

The first memory elements ME1 may be disposed on the second interlayered insulating layer 140 of the first cell array region CR1. The first memory elements ME1 may be overlapped with the first contact plugs 142, respectively, when viewed in a plan view. In other words, for example, the first memory elements ME1 may be coupled to the first contact plugs 142, respectively. The first memory elements ME1 may be electrically connected to the second impurity regions 112 of the first cell array region CR1 through the first contact plugs 142. The first memory elements ME1 may be two-dimensionally arranged in the first direction D1 and the second direction D2, when viewed in a plan view. The first memory elements ME1 may correspond to the first memory elements ME1 described with reference to FIGS. 2, 3, 4A, 4B, and 7A. In other words, for example, each of the first memory elements ME1 may include the first magnetic tunnel junction MTJ1. The first magnetic tunnel junction MTJ1 may be configured to have the same or substantially the same features as that described above, and thus, a detailed description thereof will be omitted. Some of the first memory elements ME1 may constitute the first memory cells MC1, and others of the first memory elements ME1 may constitute the first reference cells RC1. In addition, each of the first memory elements ME1 may further include a first bottom electrode BE1 and a first top electrode TE1. The first magnetic tunnel junction MTJ1 may be disposed between the first bottom electrode BE1 and the first top electrode TE1. In other words, for example, the first bottom electrode BE1 may be disposed between the first contact plug 142 and the first magnetic tunnel junction MTJ1, and the first top electrode TE1 may be disposed on the first magnetic tunnel junction MTJ1. Each of the first bottom electrode BE1 and the first top electrode TE1 may include at least one of conductive metal nitrides (e.g., titanium nitride or tantalum nitride), transition metals (e.g., titanium or tantalum), or rare-earth metals (e.g., ruthenium or platinum).

The second memory elements ME2 may be disposed on the second interlayered insulating layer 140 of the second cell array region CR2. The second memory elements ME2 may be overlapped with the second contact plugs 144, respectively, when viewed in a plan view. In other words, for example, the second memory elements ME2 may be coupled to the second contact plugs 144, respectively. The second memory elements ME2 may be electrically connected to the second impurity regions 112 of the second cell array region CR2 through the second contact plugs 144. The second memory elements ME2 may be two-dimensionally arranged in the first direction D1 and the second direction D2, when viewed in a plan view. The second memory elements ME2 may correspond to the second memory elements ME2 described with reference to FIGS. 2, 5A, 5B, and 7A. In other words, for example, some of the second memory elements ME2 may include the second magnetic tunnel junction MTJ2, and others of the second memory elements ME2 may include the third magnetic tunnel junction MTJ3. The second and third magnetic tunnel junctions MTJ2 and MTJ3 may be configured to have the same or substantially the same features as those described above, and thus, a detailed description thereof will be omitted. Some of the second memory elements ME2 may constitute the second memory cells MC2, and others of the second memory elements ME2 may constitute the second reference cells RC2. In addition, each of the second memory elements ME2 may further include a second bottom electrode BE2 and a second top electrode TE2. Each of the second and third magnetic tunnel junctions MTJ2 and MTJ3 may be disposed between the second bottom electrode BE2 and the second top electrode TE2. The second bottom electrode BE2 and the second top electrode TE2 may include the same or substantially the same material as the first bottom electrode BE1 and the second top electrode TE2, respectively.

A third interlayered insulating layer 150 may be provided on the second interlayered insulating layer 140. The third interlayered insulating layer 150 of the first and second cell array regions CR1 and CR2 may be in contact with sidewalls of the first and second memory elements ME1 and ME2. In addition, the third interlayered insulating layer 150 of the first and second cell array regions CR1 and CR2 may be provided to expose the top surfaces of the first and second memory elements ME1 and ME2. The third interlayered insulating layer 150 may be formed of or include at least one of silicon oxide, silicon nitride, or silicon oxynitride.

On the first peripheral circuit region PR1, first peripheral plugs 152 may be provided to pass through the first to third interlayered dielectric layers 130, 140, and 150 and to be in contact with the substrate 100. The first peripheral plugs 152 may be electrically coupled to the first peripheral source/drain regions 120a. On the second peripheral circuit region PR2, second peripheral plugs 154 may be provided to pass through the first to third interlayered dielectric layers 130, 140, and 150 and to be in contact with the substrate 100. The second peripheral plugs 154 may be electrically coupled to the second peripheral source/drain regions 120b. A third peripheral plug 156 may be provided to pass through the first to third interlayered dielectric layers 130, 140, and 150 of the second peripheral circuit region PR2 and the protection insulating pattern 128 and may be electrically connected to the resistance pattern 124. The first to third peripheral plugs 152, 154, and 156 may include substantially the same or substantially the same conductive material as the source lines SL.

The first bit lines BL1 may be disposed on the third interlayered insulating layer 150 of the first cell array region CR1. The first bit lines BL1 may extend in the second direction D2. Each of the first bit lines BL1 may be connected in common to a plurality of the first memory elements ME1 arranged in the second direction D2. The second bit lines BL2 may be disposed on the third interlayered insulating layer 150 of the second cell array region CR2. The second bit lines BL2 may extend in the second direction D2. Each of the second bit lines BL2 may be connected in common to a plurality of the second memory elements ME2 arranged in the second direction D2. The first and second bit lines BL1 and BL2 may be formed of or include a metallic material (e.g., copper or aluminum).

First conductive lines L1 may be disposed on the third interlayered insulating layer 150 of the first peripheral circuit region PR1. The first conductive lines L1 may be electrically coupled to the first peripheral plugs 152, respectively. Second conductive lines L2 may be disposed on the third interlayered insulating layer 150 of the second peripheral circuit region PR2. The second conductive lines L2 may be electrically coupled to the second peripheral plugs 154, respectively. A third conductive line L3 may be disposed on the third interlayered insulating layer 150 of the second peripheral circuit region PR2. The third conductive line L3 may be electrically coupled to the third peripheral plug 156. The first to third conductive lines L1, L2, and L3 may include the same or substantially the same material as the first and second bit lines BL1 and BL2.

The cell transistor and the first memory element ME1 of the first cell array region CR1 may be electrically connected to the first peripheral source/drain regions 120a of the first peripheral transistor through the first bit line BL1 and the first conductive line L1. The cell transistor and the second memory element ME2 of the second cell array region CR2 may be electrically connected to the second peripheral source/drain regions 120b of the second peripheral transistor through the second bit line BL2 and the second conductive line L2. In addition, the cell transistor and the second memory element ME2 of the second cell array region CR2 constituting the second reference cell RC2 may be electrically connected to the resistance pattern 124 through the second bit line BL2 and the third conductive line L3.

Figure 9A:
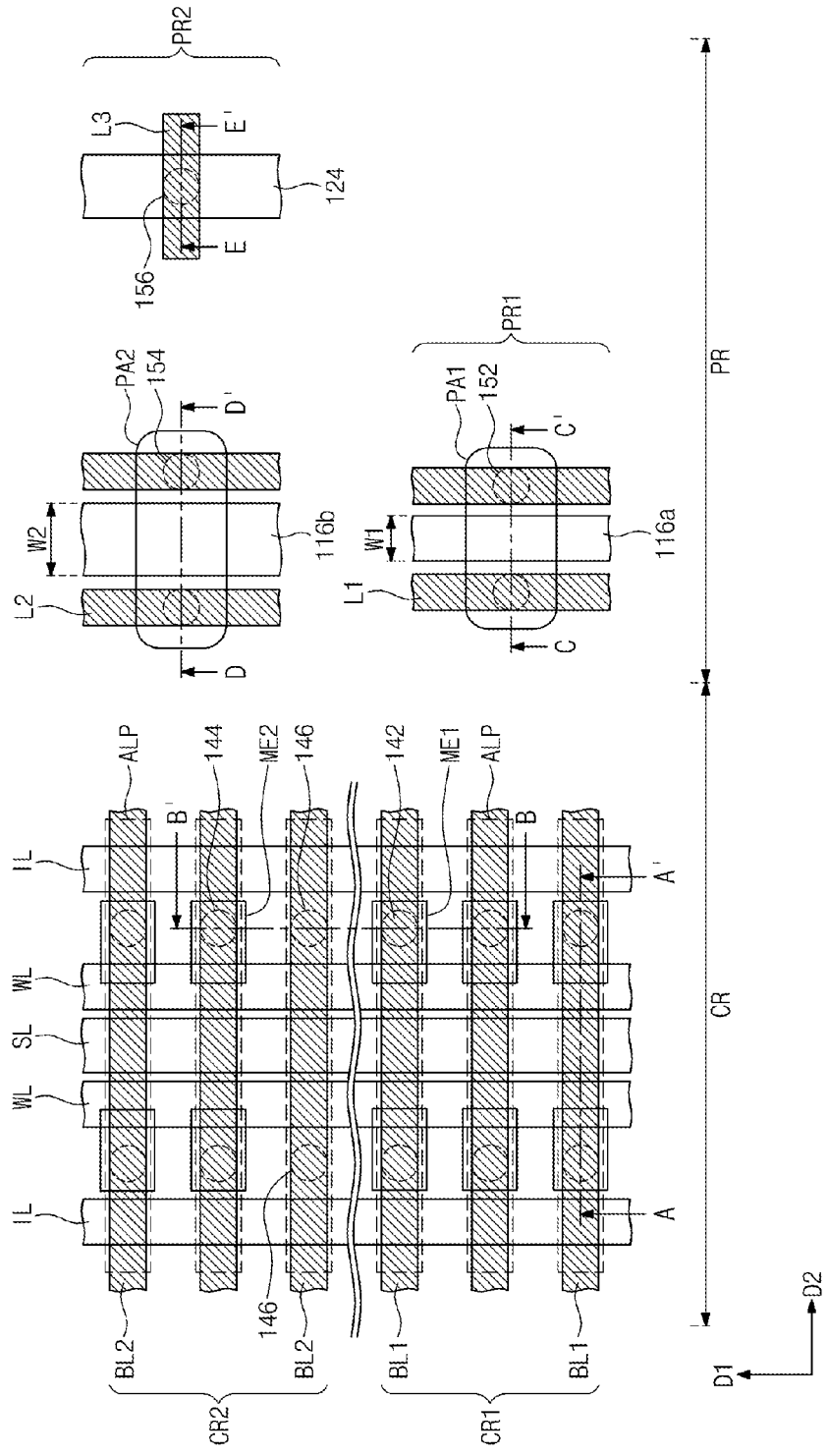
FIG. 9A is a plan view illustrating an example of a magnetic memory device according to some example embodiments of inventive concepts.
Figure 9B:
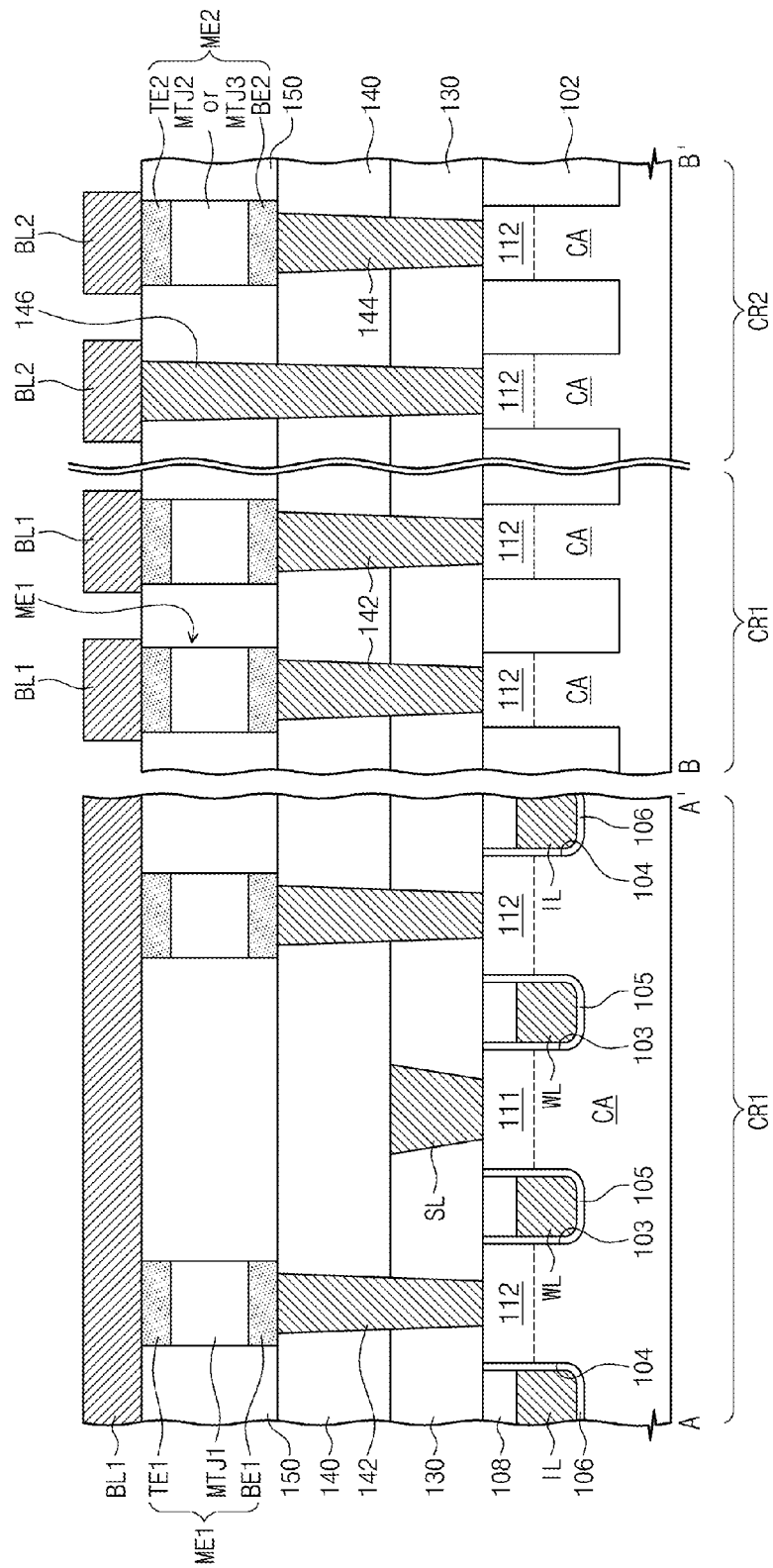
FIG. 9B is a sectional view taken along lines A-A' and B-B' of FIG. 9A.
Figure 9C:
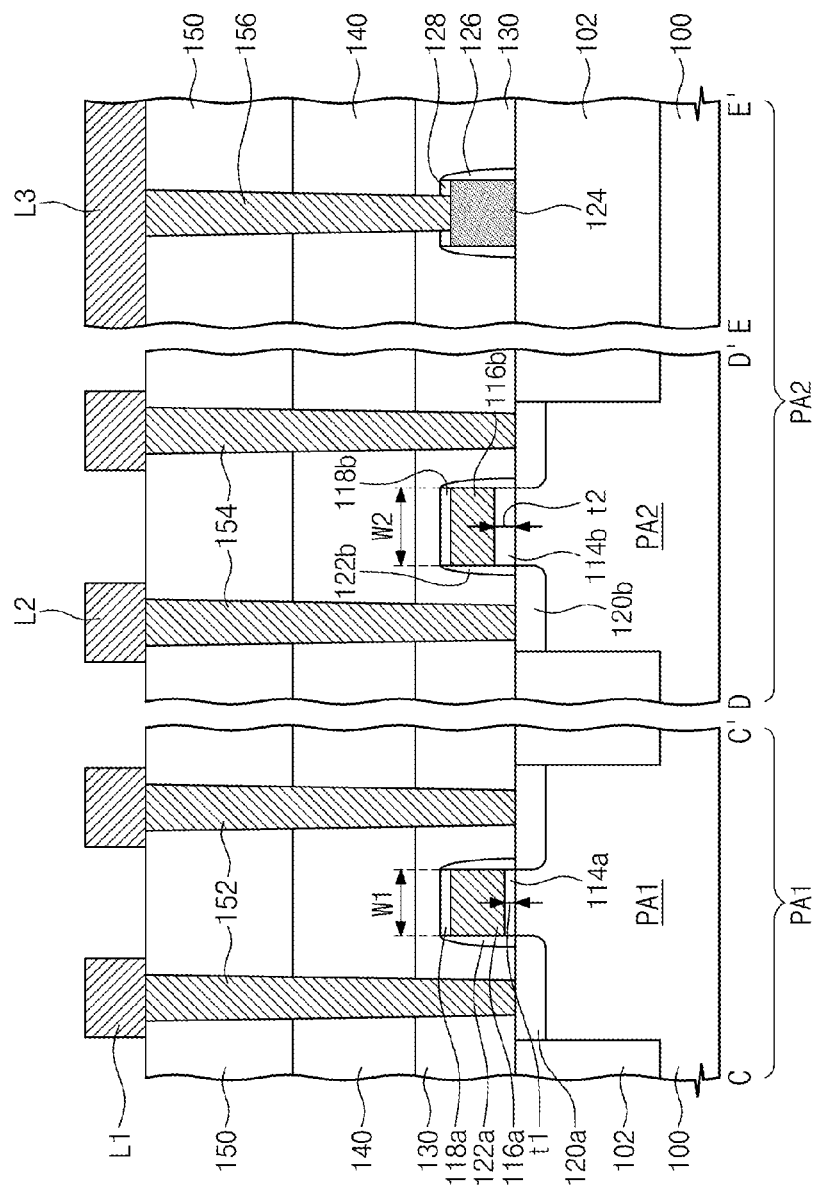
FIG. 9C is a sectional view taken along lines C-C', D-D', and E-E' of FIG. 9A.

FIG. 9A is a plan view illustrating an example of a magnetic memory device according to some example embodiments of inventive concepts. FIG. 9B is a sectional view taken along lines A-A' and B-B' of FIG. 9A. FIG. 9C is a sectional view taken along lines C-C', D-D', and E-E' of FIG. 9A. A magnetic memory device of FIGS. 9A to 9C may be configured to have features similar to or substantially the same as the magnetic memory device of FIGS. 8A to 8C, except that some of the second memory elements ME2 are replaced with third contact plugs 146. For concise description, a previously described element may be identified by a similar or identical reference number without repeating an overlapping description thereof.

Referring to FIGS. 9A to 9C, third contact plugs 146 may be provided to pass through the first to third interlayered insulating layers 130, 140, and 150, and some of the second impurity regions 112 of the second cell array region CR2 may be connected to the second bit line BL2 through the third contact plugs 146. In other words, for example, some of the cell transistors of the second cell array region CR2 may be electrically connected to the second bit line BL2 without the second memory element ME2. The cell transistors electrically connected to the second bit line BL2 through the third contact plug 146 may correspond to the second reference cells RC2 described with reference to FIG. 7B. In at least some example embodiments, a plurality of the second reference cells RC2 may be arranged in the second direction D2 and may share a corresponding one of the second bit lines BL2.

According to at least some example embodiments of inventive concepts, since a part of a memory cell array is used to realize an OTP cell array, it may be unnecessary to form an addition region for the OTP memory device. This may make it possible to realize a more highly-integrated magnetic memory device. In addition, OTP memory cells may be more easily realized by a method of forming a short circuit in a magnetic tunnel junction serving as a memory element of a memory cell. Furthermore, by separately providing a reference cell and a peripheral circuit for the OTP memory cells, it is possible to improve and/or optimize read/write operations on the OTP memory cells. This may make it possible to realize a more highly-reliable magnetic memory device.

While some example embodiments of inventive concepts have been particularly shown and described, it will be understood by one of ordinary skill in the art that variations in form and detail may be made therein without departing from the spirit and scope of the attached claims.

What is claimed is:

1. A semiconductor device, comprising:
a plurality of word lines;
a plurality of bit lines crossing the plurality of word lines, the plurality of bit lines including first bit lines and second bit lines, the second bit lines spaced apart from the first bit lines in a direction of extension of the plurality of word lines;
a plurality of first memory cells connected between the plurality of word lines and the first bit lines, each of the plurality of first memory cells including a first memory element and a first selection element, the first memory element and the first selection element connected to each other; and
a plurality of second memory cells connected between the plurality of word lines and the second bit lines, each of the plurality of second memory cells including a second memory element and a second selection element, the second memory element and the second selection element connected to each other,
wherein the first memory element includes a first magnetic tunnel junction, and the second memory element includes a second magnetic tunnel junction, each of the first magnetic tunnel junction and the second magnetic tunnel junction including a pinned layer, a free layer, and a tunnel barrier layer between the pinned layer and the free layer,
wherein the tunnel barrier layers of a first portion of the second magnetic tunnel junctions have an irreversible resistance state,
wherein the first magnetic tunnel junction has a rewritable structure, and is configured to have one of (i) a first resistance corresponding to first data, and (ii) a second resistance corresponding to second data,
wherein at least one second magnetic tunnel junction among the first portion of the second magnetic tunnel junctions has a third resistance corresponding to the first data, the at least one second magnetic tunnel junction having been programmed through a first one-time programming operation, and
wherein the first resistance, the second resistance and the third resistance are different from each other.

2. The semiconductor device of claim 1, wherein
the plurality of first memory cells are rewritable memory cells; and
the plurality of second memory cells are one-time programmable memory cells.

3. The semiconductor device of claim 1, wherein
at least one other second magnetic tunnel junction among a second portion of the second magnetic tunnel junctions has a fourth resistance corresponding to the second data, the at least one other second magnetic tunnel junction having been programmed through a second one-time programming operation; and the first resistance, the second resistance, the third resistance and the fourth resistance are different from each other.

4. The semiconductor device of claim 3, wherein
the first resistance is lower than the second resistance;
the third resistance is lower than the first resistance; and
the fourth resistance is between the first resistance and the second resistance.

5. The semiconductor device of claim 3, wherein
one or more of the plurality of first memory cells are configured as one or more first reference cells for a reading operation on the plurality of first memory cells; and
one or more of the plurality of second memory cells are configured as one or more second reference cells for a reading operation on the plurality of second memory cells.

6. The semiconductor device of claim 5, wherein the one or more second reference cells are second memory cells including the second magnetic tunnel junctions.

7. The semiconductor device of claim 1, further comprising:
a first peripheral circuit electrically connected to the plurality of first memory cells through the first bit lines; and
a second peripheral circuit electrically connected to the plurality of second memory cells through the second bit lines,
wherein the second peripheral circuit includes at least one second peripheral transistor configured to operate according to a voltage higher than a first peripheral transistor of the first peripheral circuit.

8. The semiconductor device of claim 7, wherein
the first peripheral transistor includes a first peripheral gate dielectric layer and a first peripheral gate electrode;
the at least one second peripheral transistor includes a second peripheral gate dielectric layer and a second peripheral gate electrode; and
the second peripheral gate dielectric layer has a thickness greater than that of the first peripheral gate dielectric layer.

9. A semiconductor device, comprising:
a memory cell array including an array of reprogrammable cells and an array of one-time programmable (OTP) cells;
a first peripheral circuit electrically connected to the array of reprogrammable cells through first bit lines; and
a second peripheral circuit electrically connected to the array of OTP cells through second bit lines; wherein
the array of reprogrammable cells includes a plurality of first memory cells, each of the plurality of first memory cells including a first magnetic tunnel junction and a first selection transistor, the first magnetic tunnel junction and the first selection transistor connected to each other,
the array of OTP cells includes a plurality of second memory cells, each of the plurality of second memory cells including a second magnetic tunnel junction and a second selection transistor, the second magnetic tunnel junction and the second selection transistor connected to each other,
a first portion of the second magnetic tunnel junctions have an irreversible resistance state,
the first peripheral circuit includes at least one first peripheral transistor, the second peripheral circuit includes at least one second peripheral transistor, and the at least one second peripheral transistor is configured to operate in response to a voltage higher than the at least one first peripheral transistor.

10. The semiconductor device of claim 9, wherein the first magnetic tunnel junction has a rewritable structure, and one of (i) a first resistance corresponding to first data, and (ii) a second resistance corresponding to second data;

at least one second magnetic tunnel junction among the first portion of the second magnetic tunnel junctions has a third resistance corresponding to the first data, the at least one second magnetic tunnel junction among the first portion of the second magnetic tunnel junctions having been programmed through a first one-time programming operation;

at least one second magnetic tunnel junction among a second portion of the second magnetic tunnel junctions has a fourth resistance corresponding to the second data, the at least one second magnetic tunnel junction among the second portion of the second magnetic tunnel junctions having been programmed through a second one-time programming operation;

the first resistance is lower than the second resistance;

the third resistance is lower than the first resistance; and the fourth resistance is between the first and second resistances.

11. The semiconductor device of claim 10, wherein one or more first memory cells among the plurality of first memory cells are configured as one or more first reference cells for a reading operation on the plurality of first memory cells; and one or more second memory cells among the plurality of second memory cells are configured as one or more second reference cells for a reading operation on the plurality of second memory cells.

12. The semiconductor device of claim 11, wherein the second peripheral circuit further includes a control resistor electrically connected to the one or more second reference cells; and a reference resistance for the reading operation on the plurality of second memory cells is a sum of the third resistance and a resistance of the control resistor.

13. The semiconductor device of claim 10, wherein one or more of the plurality of first memory cells are configured as one or more reference cells for a reading operation on the plurality of first memory cells;

the array of OTP cells further includes a second reference cell for a reading operation on the plurality of second memory cells; and the second reference cell includes a third selection transistor connected to one of the second bit lines without a variable resistance device arranged between the third selection transistor and the one of the second bit lines.

14. The semiconductor device of claim 13, wherein the second peripheral circuit further includes a control resistor electrically connected to the second reference cell; and a reference resistance for the reading operation on the plurality of second memory cells is a resistance of the control resistor.

15. A semiconductor device comprising:

a memory cell array including an array of first magnetic memory cells and an array of second magnetic memory cells, each first magnetic memory cell in the array of first magnetic memory cells including a first magnetic tunnel junction structure having a rewritable structure, and each second magnetic memory cell in the array of second magnetic memory cells including a second magnetic tunnel junction structure having a one-time programmable (OTP) resistance state; wherein the first magnetic tunnel junction structure has one of (i) a first resistance corresponding to first data, and (ii) a second resistance corresponding to second data, the second magnetic tunnel junction structure has a third resistance corresponding to the first data, the second magnetic tunnel junction structure having been programmed through a one-time programming operation, and the first resistance, the second resistance and the third resistance are different from each other.

16. The semiconductor device of claim 15, wherein the first magnetic tunnel junction structure and the second magnetic tunnel junction structure have a same layer structure; and the same layer structure includes a pinned magnetic layer, a free magnetic layer, and a tunnel barrier layer between the pinned magnetic layer and the free magnetic layer.

17. The semiconductor device of claim 15, wherein the second magnetic tunnel junction structure is configured to be set in an irreversible dielectric breakdown state.

18. The semiconductor device of claim 17, wherein the first magnetic tunnel junction structure includes a first pinned layer having a first pinned magnetization direction, a first tunnel barrier layer on the first pinned layer, and a first free layer on the first tunnel barrier layer, the first free layer having a first variable magnetization direction; and the second magnetic tunnel junction structure includes a second pinned layer having a second pinned magnetization direction, a second tunnel barrier layer on the second pinned layer, the second tunnel barrier layer set in the irreversible dielectric breakdown state, and a second free layer on the second tunnel barrier layer, the second free layer having a second variable magnetization direction.

19. The semiconductor device of claim 15, further comprising:

a first peripheral circuit including a plurality of first transistors, the first peripheral circuit configured to apply a first voltage to first magnetic memory cells in the array of first magnetic memory cells; and a second peripheral circuit including a plurality of second transistors, the second peripheral circuit configured to apply a second voltage to second magnetic memory cells in the array of second magnetic memory cells; wherein the plurality of second transistors have a threshold voltage greater than a threshold voltage of the plurality of first transistors, and the second voltage is greater than the first voltage.

* * * * *